(12) United States Patent
Ai

(10) Patent No.: US 11,823,992 B2
(45) Date of Patent: Nov. 21, 2023

(54) SEMICONDUCTOR DEVICE WITH UNEVEN ELECTRODE SURFACE AND METHOD FOR FABRICATING THE SAME

(71) Applicant: NANYA TECHNOLOGY CORPORATION, New Taipei (TW)

(72) Inventor: Tsu-Chieh Ai, Taitung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 16 days.

(21) Appl. No.: 17/484,485

(22) Filed: Sep. 24, 2021

(65) Prior Publication Data
US 2023/0105066 A1    Apr. 6, 2023

(51) Int. Cl.
*H01L 21/768* (2006.01)
*H01L 23/498* (2006.01)

(52) U.S. Cl.
CPC .. *H01L 23/49838* (2013.01); *H01L 21/76838* (2013.01)

(58) Field of Classification Search
CPC ................ H01L 28/40–92; H01L 21/76838
See application file for complete search history.

(56) References Cited

U.S. PATENT DOCUMENTS

| | | | |
|---|---|---|---|
| 2009/0000093 A1* | 1/2009 | Sasaki | H01G 4/005 361/321.1 |
| 2020/0144269 A1* | 5/2020 | Kim | H10B 12/03 |

FOREIGN PATENT DOCUMENTS

| | | |
|---|---|---|
| CN | 102290398 A | 12/2011 |
| TW | 202123477 A | 6/2021 |
| TW | 202129983 A | 8/2021 |

OTHER PUBLICATIONS

Office Action with the search report dated Sep. 19, 2022 related to Taiwanese Application No. 110147969.

* cited by examiner

*Primary Examiner* — Thanhha S Pham
(74) *Attorney, Agent, or Firm* — Xuan Zhang

(57) ABSTRACT

The present application discloses a semiconductor device and a method for fabricating the semiconductor device. The semiconductor device includes a substrate; a bottom conductive layer positioned on the substrate; at least one bottom conductive protrusion positioned on the bottom conductive layer; an insulator layer positioned on the bottom conductive layer and the at least one bottom conductive protrusion; at least one bottom insulating protrusion protruding from the insulator layer towards the bottom conductive layer and adjacent to the at least one bottom conductive protrusion; and a top conductive layer positioned on the insulator layer. The bottom conductive layer, the at least one bottom conductive protrusion, the insulator layer, the at least one bottom insulating protrusion, and the top conductive layer together configure a capacitor structure.

8 Claims, 21 Drawing Sheets

SEMICONDUCTOR DEVICE WITH UNEVEN ELECTRODE SURFACE AND METHOD FOR FABRICATING THE SAME

TECHNICAL FIELD

The present disclosure relates to a semiconductor device and a method for fabricating the semiconductor device, and more particularly, to a semiconductor device with an uneven electrode surface and a method for fabricating the semiconductor device with the uneven electrode surface.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a bottom conductive layer positioned on the substrate; at least one bottom conductive protrusion positioned on the bottom conductive layer; an insulator layer positioned on the bottom conductive layer and the at least one bottom conductive protrusion; at least one bottom insulating protrusion protruding from the insulator layer towards the bottom conductive layer and adjacent to the at least one bottom conductive protrusion; and a top conductive layer positioned on the insulator layer. The bottom conductive layer, the at least one bottom conductive protrusion, the insulator layer, the at least one bottom insulating protrusion, and the top conductive layer together configure a capacitor structure.

In some embodiments, a width of the at least one bottom conductive protrusion and a width of the at least one bottom insulating protrusion are substantially the same.

In some embodiments, a width of the at least one bottom conductive protrusion and a width of the at least one bottom insulating protrusion are different.

In some embodiments, the semiconductor device includes a first contact electrically coupled to the bottom conductive layer.

In some embodiments, the semiconductor device includes a second contact positioned on the top conductive layer and electrically coupled to the top conductive layer.

In some embodiments, a width of the bottom conductive layer is greater than a width of the insulator layer.

In some embodiments, a width of the bottom conductive layer is greater than a width of the top conductive layer.

In some embodiments, a ratio of a thickness of the bottom conductive protrusion to a thickness of the bottom conductive layer is between about 1:5 and about 1:20.

In some embodiments, a ratio of a thickness of the bottom insulating protrusion to a thickness of the insulator layer is between about 1:1 and about 3:1.

Another aspect of the present disclosure provides a semiconductor device including a substrate; a bottom conductive layer positioned on the substrate; at least one bottom conductive protrusion positioned on the bottom conductive layer; an insulator layer positioned on the bottom conductive layer and the at least one bottom conductive protrusion; at least one bottom insulating protrusion protruding from the insulator layer towards the bottom conductive layer and adjacent to the at least one bottom conductive protrusion; at least one top insulating protrusion positioned on the insulator layer; a top conductive layer positioned on the insulator layer and the at least one top insulating protrusion; and at least one top conductive protrusion protruding from the top conductive layer towards the insulator layer and adjacent to the at least one top insulating protrusion. The bottom conductive layer, the at least one bottom conductive protrusion, the insulator layer, the at least one bottom insulating protrusion, the at least one top insulating protrusion, the top conductive layer, and the at least one top conductive protrusion together configure a capacitor structure.

In some embodiments, a width of the at least one top insulating protrusion and a width of the at least one top conductive protrusion are substantially the same.

In some embodiments, a width of the at least one top insulating protrusion and a width of the at least one bottom conductive protrusion are different.

In some embodiments, a ratio of a thickness of the at least one top conductive protrusion to a thickness of the top conductive layer is between about 1:5 and about 1:20.

In some embodiments, a ratio of a thickness of the at least one top insulating protrusion to a thickness of the insulator layer is between about 1:1 and about 3:1.

In some embodiments, a thickness of the at least one bottom conductive protrusion and a thickness of the at least one top conductive protrusion are substantially the same.

In some embodiments, a thickness of the at least one bottom conductive protrusion and a thickness of the at least one top conductive protrusion are different.

In some embodiments, the bottom conductive layer includes doped polycrystalline silicon, doped polycrystalline germanium, doped polycrystalline silicon germanium, tungsten, cobalt, zirconium, tantalum, titanium, aluminum, ruthenium, copper, metal carbides, metal nitrides, transition metal aluminides, or a combination thereof.

In some embodiments, the insulator layer includes a high-k material, an oxide, a nitride, or an oxynitride.

Another aspect of the present disclosure provides a method for fabricating a semiconductor device including providing a substrate; forming a bottom conductive layer on the substrate; patterning the bottom conductive layer to form at least one bottom conductive protrusion and at least one bottom recess adjacent to the bottom conductive protrusion; forming an insulator layer on the bottom conductive layer and on the at least one bottom conductive protrusion, and forming at least one bottom insulating protrusion filling the at least one bottom recess; and forming a top conductive layer on the insulator layer. The bottom conductive layer, the at least one bottom conductive protrusion, the insulator layer, the at least one bottom insulating protrusion, and the top conductive layer together configure a capacitor structure.

Another aspect of the present disclosure provides a method for fabricating a semiconductor device including providing a substrate; forming a bottom conductive layer on the substrate; patterning the bottom conductive layer to form at least one bottom conductive protrusion and at least one bottom recess adjacent to the bottom conductive protrusion; forming an insulator layer on the bottom conductive layer and on the at least one bottom conductive protrusion, and forming at least one bottom insulating protrusion filling the at least one bottom recess; patterning the insulator layer to form at least one top insulating protrusion and at least one top recess adjacent to the top insulating protrusion; forming a top conductive layer on the insulator layer and on the at least one top insulating protrusion, and forming at least one top conductive protrusion filling the at least one top recess. The bottom conductive layer, the at least one bottom conductive protrusion, the insulator layer, the at least one bottom insulating protrusion, the at least one top insulating protrusion, the top conductive layer, and the at least one top conductive protrusion together configure a capacitor structure.

Due to the design of the semiconductor device of the present disclosure, the plurality of bottom conductive protrusions and the plurality of bottom insulating protrusions may increase the contact surface between the insulator of the capacitor structure and the bottom electrode of the capacitor structure, and the plurality of top insulating protrusions and the plurality of top conductive protrusions may increase the contact surface between the insulator of the capacitor structure and the top electrode of the capacitor structure. Therefore, the capacitance of the capacitor structure may be increased. As a result, the performance of the capacitor structure as well as the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
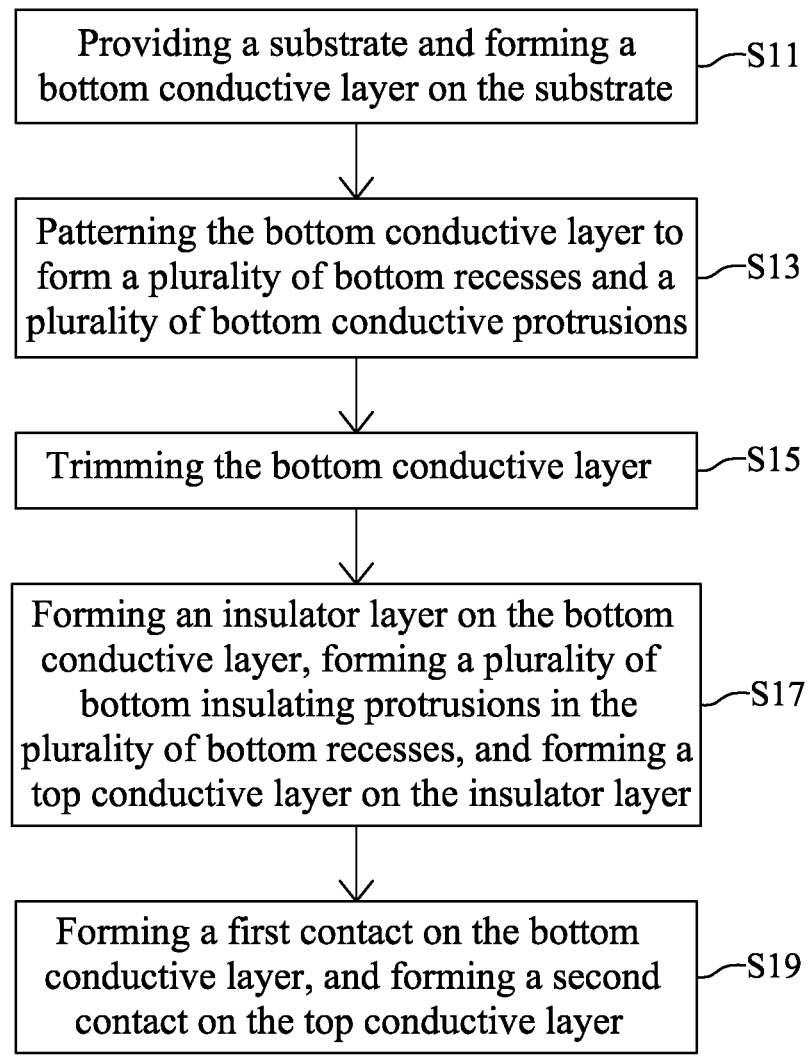
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 9 illustrate, in schematic cross-sectional view diagrams, a flow for fabricating the semiconductor device 1A in accordance with one embodiment of the present disclosure.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
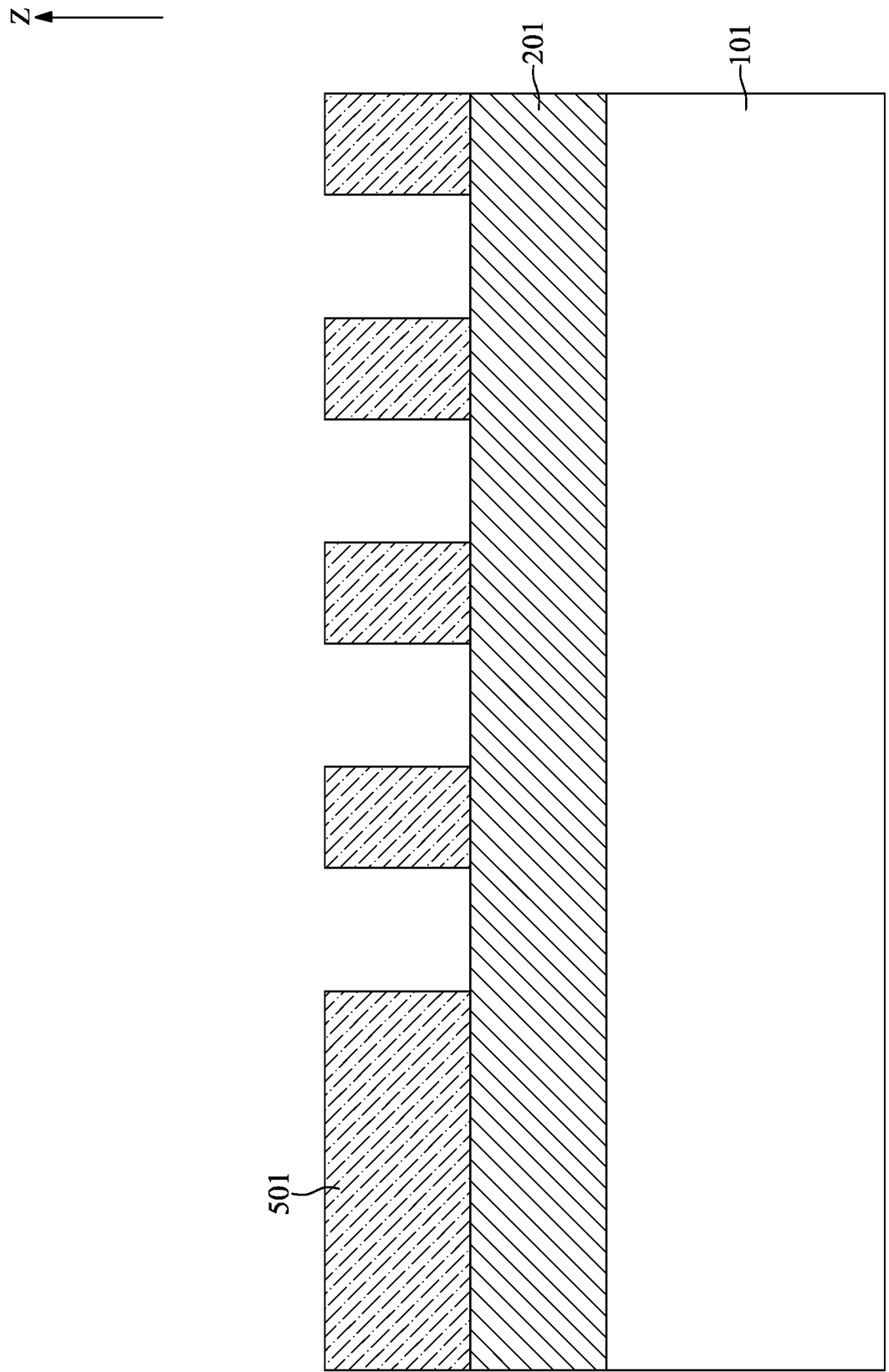
FIGS. 2 to 9 illustrate, in schematic cross-sectional view diagrams, a flow for fabricating the semiconductor device in accordance with one embodiment of the present disclosure.

With reference to FIGS. 1 and 2, at step S11, a substrate 101 may be provided and a bottom conductive layer 201 may be formed on the substrate 101.

With reference to FIG. 2, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the substrate 101 may include dielectrics or conductive features disposed on the bulk semiconductor substrate or the topmost semiconductor material layer. The dielectrics may be formed of, for example, silicon oxide, borophosphosilicate glass, undoped silicate glass, fluorinated silicate glass, low-k dielectric materials, the like, or a combination thereof. Each of the dielectrics may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like. The conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation. The device elements may be electrically coupled to each other though the conductive features.

It should be noted that, in the description of the present disclosure, the term "substrate" and "wafer" are used interchangeably, both referring to a surface, or portion of a surface, upon which a process act. A substrate may also refer to only a portion of the substrate unless the context clearly indicates otherwise. Additionally, reference to depositing on a substrate may mean both a bare substrate and a substrate with one or more films or features deposited or formed thereon.

With reference to FIG. 2, the bottom conductive layer 201 may be formed on the substrate 101. In some embodiments, the bottom conductive layer 201 may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bottom conductive layer 201 may be formed by, for example, chemical vapor deposition, physical vapor deposition, sputtering, the like, or other applicable deposition process.

With reference to FIG. 2, a first patterning layer 501 may be formed on the bottom conductive layer 201. The first patterning layer 501 may include the pattern of a plurality of bottom recesses 203 which will be illustrated later. In some embodiments, the first patterning layer 501 may be a photoresist layer. In some embodiments, the first patterning layer 501 may be a hard mask layer. The hard mask layer may be formed of, for example, silicon oxide, silicon nitride, silicon oxynitride, silicon nitride oxide, boron nitride, the like, or other applicable dielectric materials.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 3:
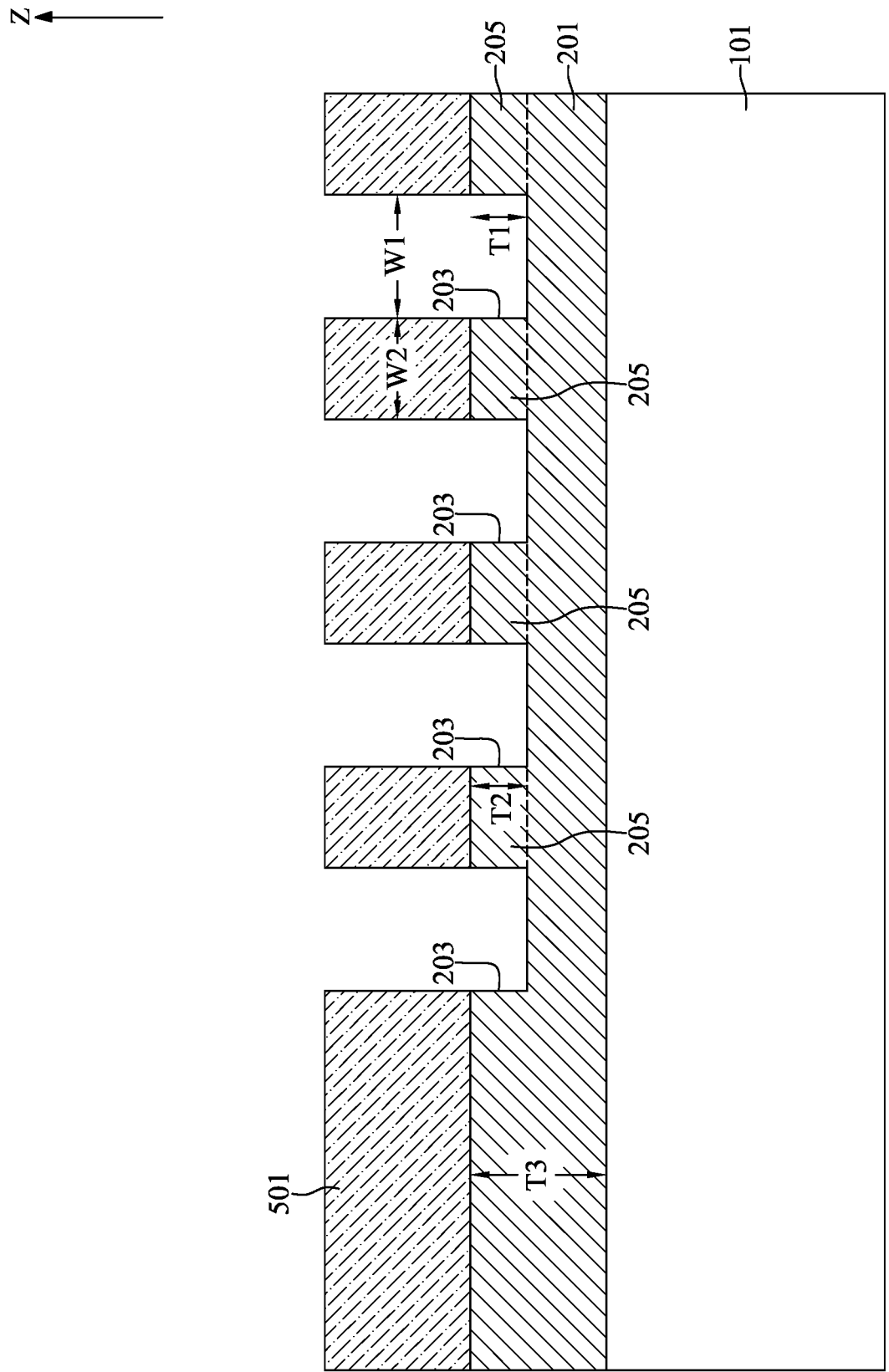

With reference to FIGS. 1 and 3, at step S13, the bottom conductive layer 201 may be patterned to form the plurality of bottom recesses 203 and a plurality of bottom conductive protrusions 205.

With reference to FIG. 3, a first etch process may be performed using the first patterning layer 501 as a pattern guide to remove portions of the bottom conductive layer 201. After the first etch process, the plurality of bottom recesses 203 may be formed. The remaining protrusions of the bottom conductive layer 201 adjacent to the plurality of bottom recesses 203 may be referred to as the plurality of bottom conductive protrusions 205. The plurality of bottom recesses 203 and the plurality of bottom conductive protrusions 205 may be alternatively arranged along a direction perpendicular to the direction Z and arranged at the upper portion of the bottom conductive layer 201.

In some embodiments, the etch rate ratio of the bottom conductive layer 201 to the first patterning layer 501 may be between about 100:1 and about 1.05:1, between about 15:1 and about 2:1, or between about 10:1 and about 2:1 during the first etch process. In some embodiments, the end point of the first etch process may be determined by a fixed etch time. In some embodiments, the first etch process may be an anisotropic etch process such as a reactive ion etch process. In some embodiments, the first etch process may be an isotropic etch process such as a wet etch process.

In some embodiments, the process temperature of the first etch process may be between about 200° C. and about 550° C. In some embodiments, the process temperature of the first etch process may be between about 300° C. and about 450° C. In some embodiments, the etchant gases of the first etch process may be a mixture of chlorine gas and boron trichloride gas.

After the first etch process, the first patterning layer 501 may be removed by an ashing process or other applicable semiconductor process.

In some embodiments, the sidewalls of the plurality of bottom recesses 203 (i.e., the sidewalls of the plurality of bottom conductive protrusions 205) may be substantially flat when the first etch process is an anisotropic etch process. In some embodiments, the bottom surfaces of the plurality of bottom recesses 203 may be substantially flat when the first etch process is an anisotropic etch process. In some embodiments, the sidewalls of the plurality of bottom recesses 203 (i.e., the sidewalls of the plurality of bottom conductive protrusions 205) may be rounding when the first etch process is an isotropic etch process. In some embodiments, the bottom surfaces of the plurality of bottom recesses 203 may be concave when the first etch process is an isotropic etch process.

For brevity, clarity, and convenience of description, only one bottom recess 203 and one bottom conductive protrusion 205 are described. In some embodiments, the width W1 of the bottom recess 203 and the width W2 of the bottom conductive protrusion 205 may be substantially the same. In some embodiments, the ratio of the thickness T1 of the bottom recess 203 to the thickness T3 of the bottom conductive layer 201 may be between about 1:3 and about 1:30, between about 1:4 and about 1:25, or between about 1:5 and about 1:20. In some embodiments, the ratio of the thickness T2 of the bottom conductive protrusion 205 to the thickness T3 of the bottom conductive layer 201 may be between about 1:3 and about 1:30, between about 1:4 and about 1:25, or between about 1:5 and about 1:20.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

It should be noted that, in the description of the present disclosure, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

It should be noted that, in the description of the present disclosure, a surface is "substantially flat" if there exists a horizontal plane from which the surface does not deviate by more than three times the root mean square roughness of the surface.

Figure 4:
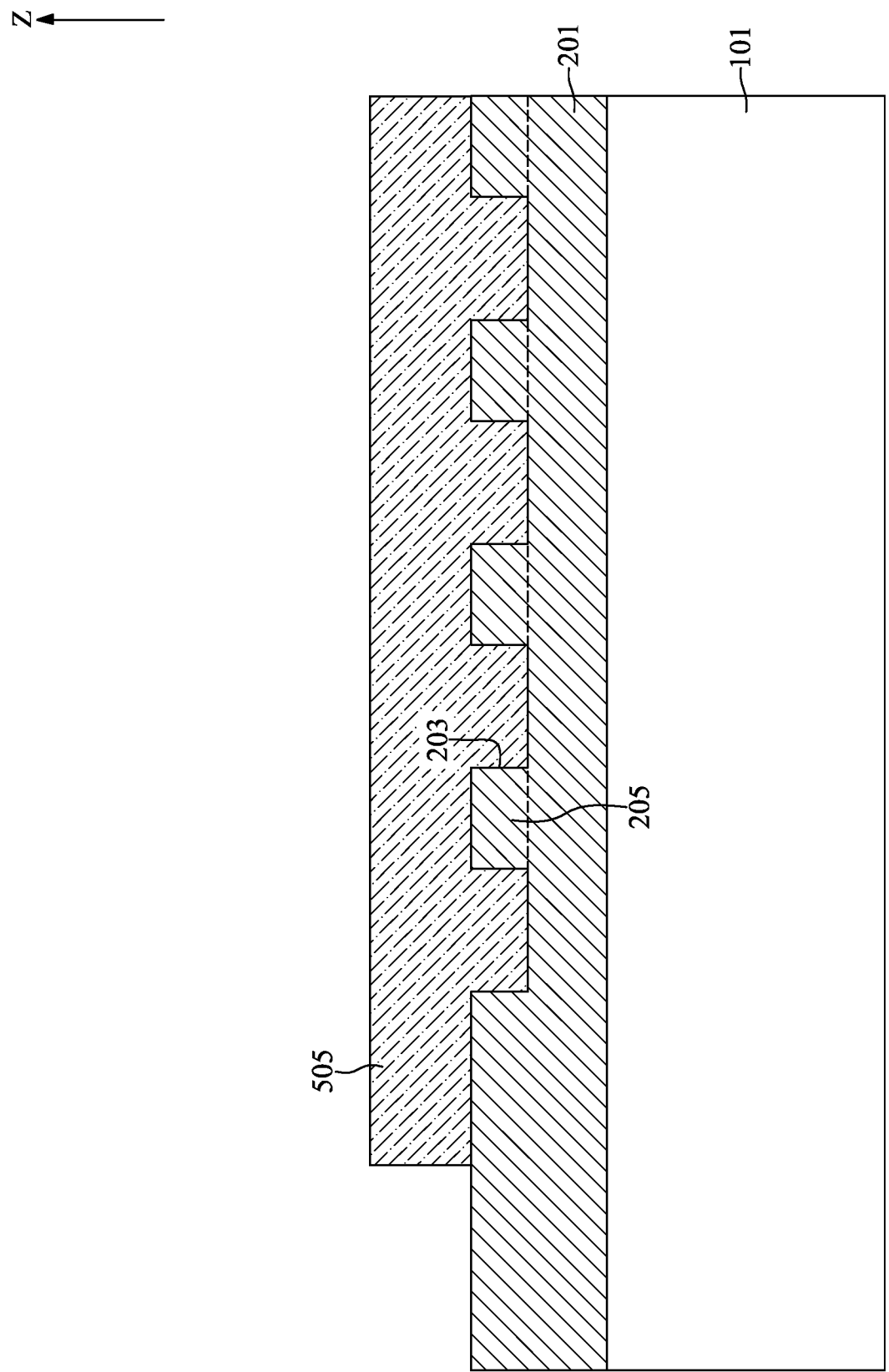
Figure 5:
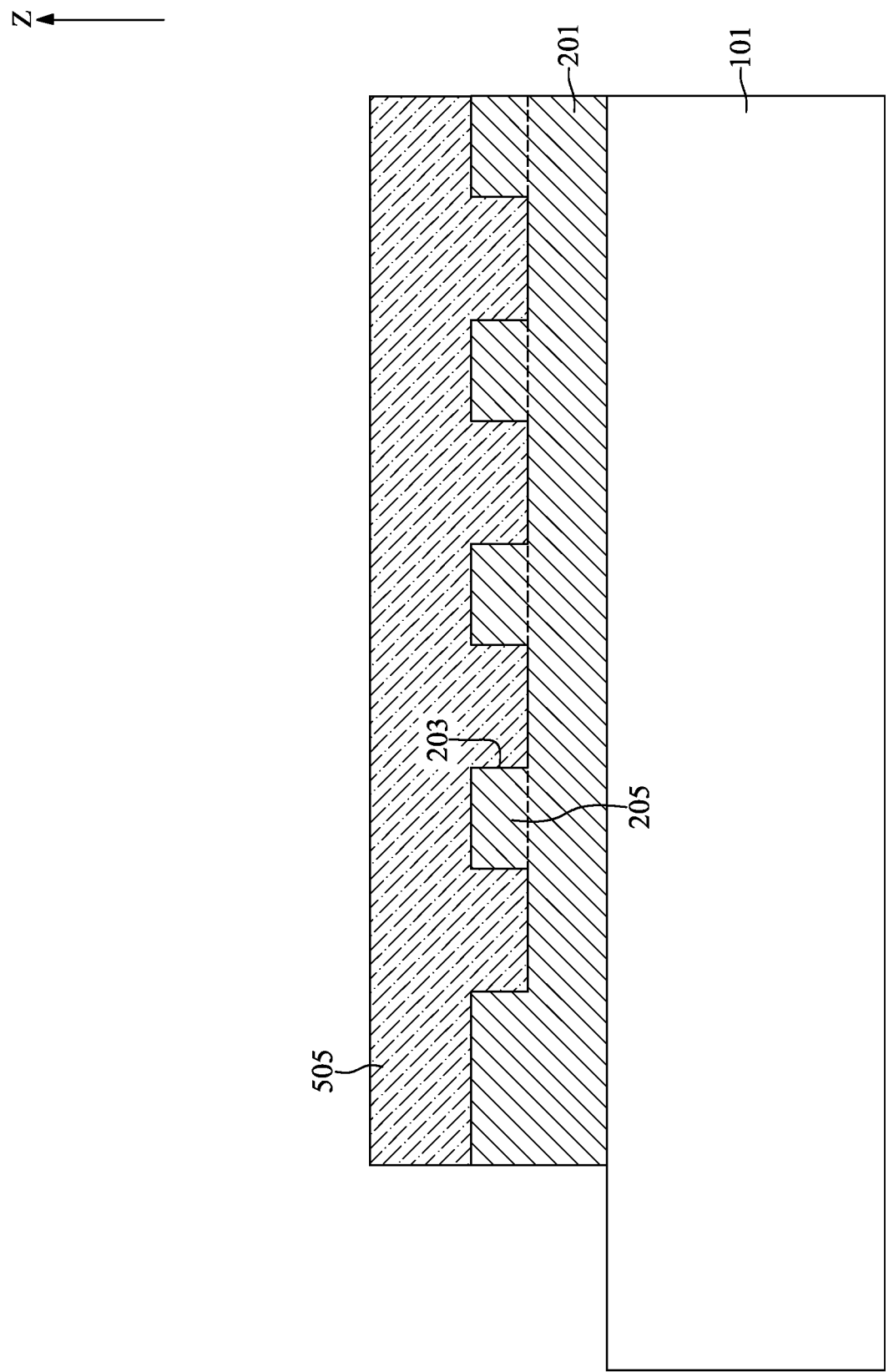

With reference to FIGS. 1, 4, and 5, at step S15, the bottom conductive layer 201 may be trimmed.

With reference to FIG. 4, a first mask layer 505 may be formed on the bottom conductive layer 201, on the plurality of bottom conductive protrusions 205, and completely filling the plurality of bottom recesses 203. In some embodiments, the first mask layer 505 may be a photoresist layer. In some embodiments, the first mask layer 505 may be a hard mask layer. The hard mask layer may be formed of, for example, silicon oxide, silicon nitride, silicon oxynitride, silicon nitride oxide, boron nitride, the like, or other applicable dielectric materials.

With reference to FIG. 5, a second etch process may be performed using the first mask layer 505 as a pattern guide to remove portions of the bottom conductive layer 201. After the second etch process, the bottom conductive layer 201 may be trimmed. In other words, the width of the bottom conductive layer 201 may be less than the width of the substrate 101. In some embodiments, the etch rate ratio of the bottom conductive layer 201 to the first patterning layer 501 may be between about 100:1 and about 1.05:1, between about 15:1 and about 2:1, or between about 10:1 and about 2:1 during the second etch process. In some embodiments, the first etch process and the second etch process may be the same. In some embodiments, the second etch process may be an anisotropic etch process such as a reactive ion etch process. In some embodiments, the second etch process may be an isotropic etch process such as a wet etch process.

In some embodiments, the process temperature of the second etch process may be between about 200° C. and about 550° C. In some embodiments, the process temperature of the second etch process may be between about 300° C. and about 450° C. In some embodiments, the etchant gases of the second etch process may be a mixture of chlorine gas and boron trichloride gas.

After the second etch process, the first mask layer 505 may be removed by an ashing process or other applicable semiconductor process.

It should be noted that, in the description of the present disclosure, a "width" refers to a size of an element (e.g., a layer, plug, trench, hole, opening, recess, etc.) in a cross-sectional perspective measured from a side surface to an opposite surface of the element.

With reference to FIG. 1 and FIGS. 6 to 8, at step S17, an insulator layer 301 may be formed on the bottom conductive layer 201, a plurality of bottom insulating protrusions 303 may be formed in the plurality of bottom recesses 203, and a top conductive layer 401 may be formed on the insulator layer 301.

Figure 6:
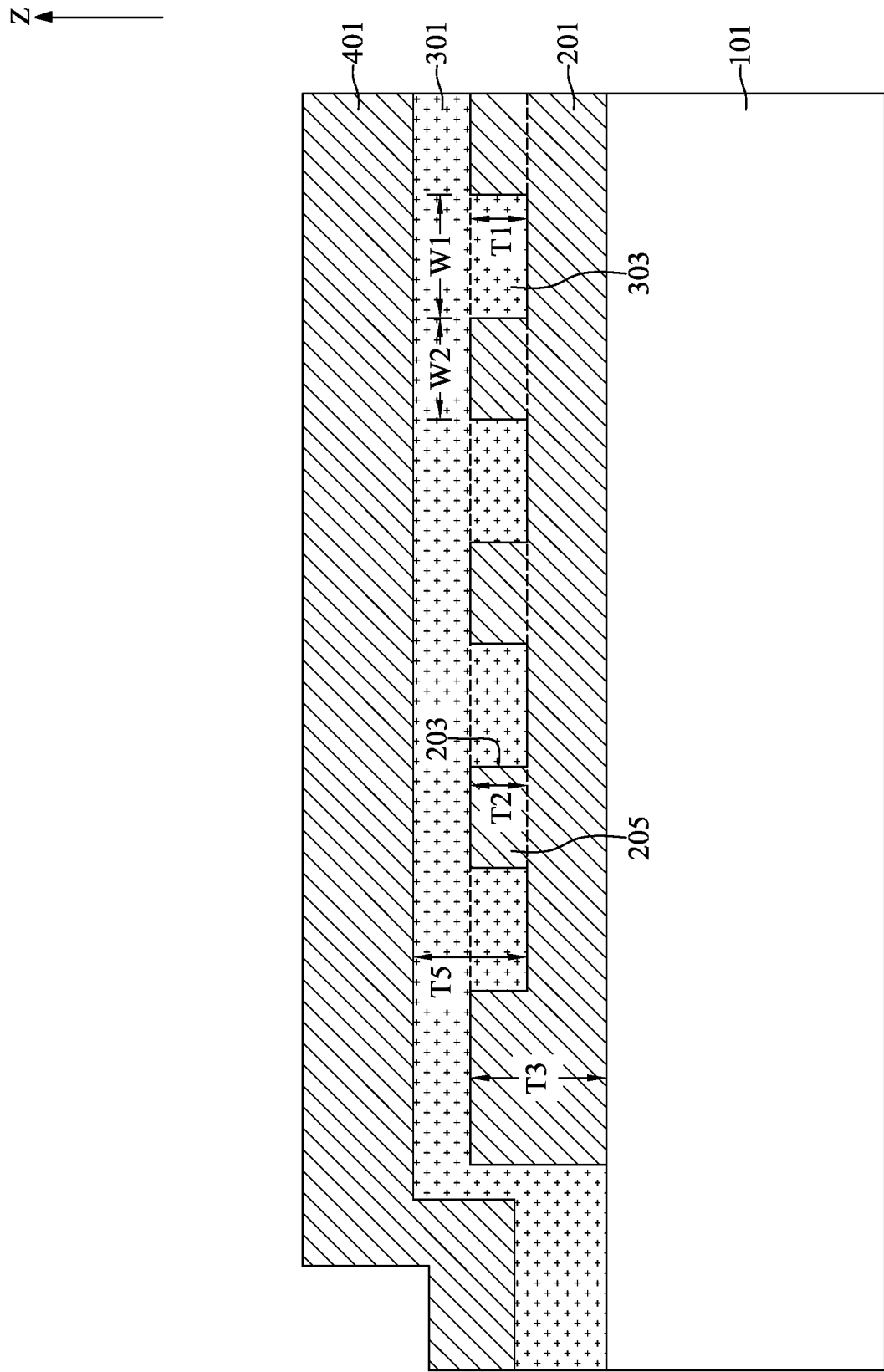

With reference to FIG. 6, the insulator layer 301 may be conformally formed on the bottom conductive layer 201, on the plurality of bottom conductive protrusions 205, and completely filling the plurality of bottom recesses 203. The portions of the insulator layer 301 filling the plurality of bottom recesses 203 may be referred to as the plurality of bottom insulating protrusions 303. For brevity, clarity, and convenience of description, only one bottom insulating protrusion 303 is described. In some embodiments, the insulator layer 301 and the bottom insulating protrusion 303 may include, for example, a high-k material, an oxide, a nitride, an oxynitride or a combination thereof. The high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material. In some embodiments, the insulator layer 301 and the bottom insulating protrusion 303 may be formed by a deposition process including, for example, chemical vapor deposition, plasma enhanced chemical vapor deposition, evaporation, or spin-on coating.

In some embodiments, a planarization process, such as chemical mechanical polishing, may be performed on the insulator layer 301 to provide a substantially flat surface for subsequent processing steps.

In some embodiments, the dimension and shape of the bottom insulating protrusion 303 is determined by the bottom recess 203; therefor, the bottom insulating protrusion 303 has the same width W1 and the same thickness T1. In some embodiments, the width W1 of the bottom insulating protrusion 303 and the width W2 of the bottom conductive protrusion 205 may be substantially the same. In some embodiments, the ratio of the thickness T1 of the bottom insulating protrusion 303 to the thickness T3 of the bottom conductive layer 201 may be between about 1:3 and about 1:30, between about 1:4 and about 1:25, or between about 1:5 and about 1:20. In some embodiments, the ratio of the thickness T1 of the bottom insulating protrusion 303 to the thickness T5 of the insulator layer 301 may be between about 8:1 and about 1:1, between about 5:1 and about 1:1, or between about 3:1 and about 1:1.

With reference to FIG. 6, the top conductive layer 401 may be conformally formed on the insulator layer 301. In some embodiments, the top conductive layer 401 may be formed of the same material as the bottom conductive layer 201. In some embodiments, the top conductive layer 401 may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The top conductive layer 401 may be formed by, for example, chemical vapor deposition, physical vapor deposition, sputtering, the like, or other applicable deposition process.

In some embodiments, a planarization process, such as chemical mechanical polishing, may be performed on the top conductive layer 401 to provide a substantially flat surface for subsequent processing steps.

Figure 7:
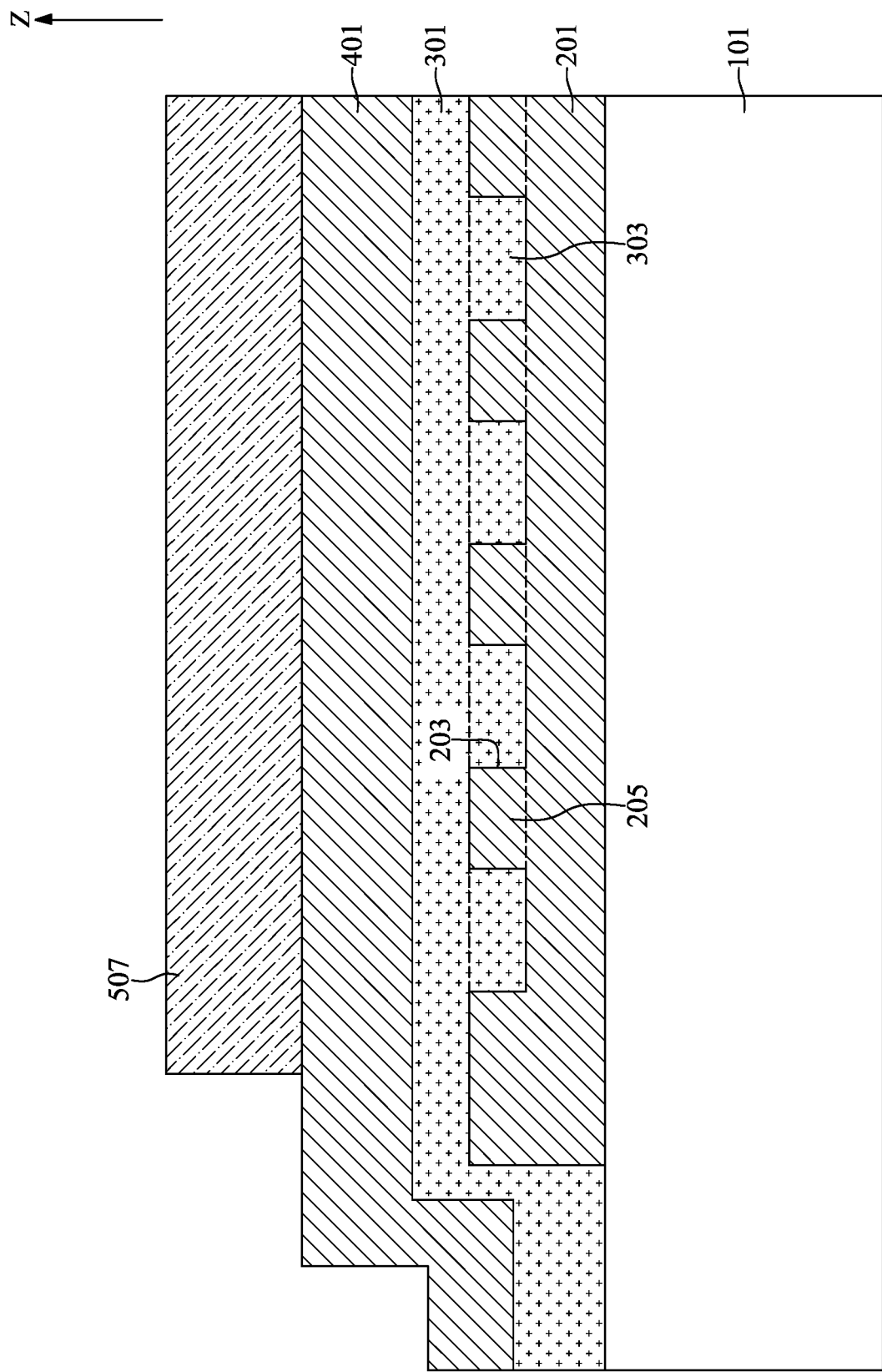

With reference to FIG. 7, a second mask layer 507 may be formed on the top conductive layer 401. In some embodiments, the second mask layer 507 may be a photoresist layer. In some embodiments, the second mask layer 507 may be a hard mask layer. The hard mask layer may be formed of, for example, silicon oxide, silicon nitride, silicon oxynitride, silicon nitride oxide, boron nitride, the like, or other applicable dielectric materials.

Figure 8:
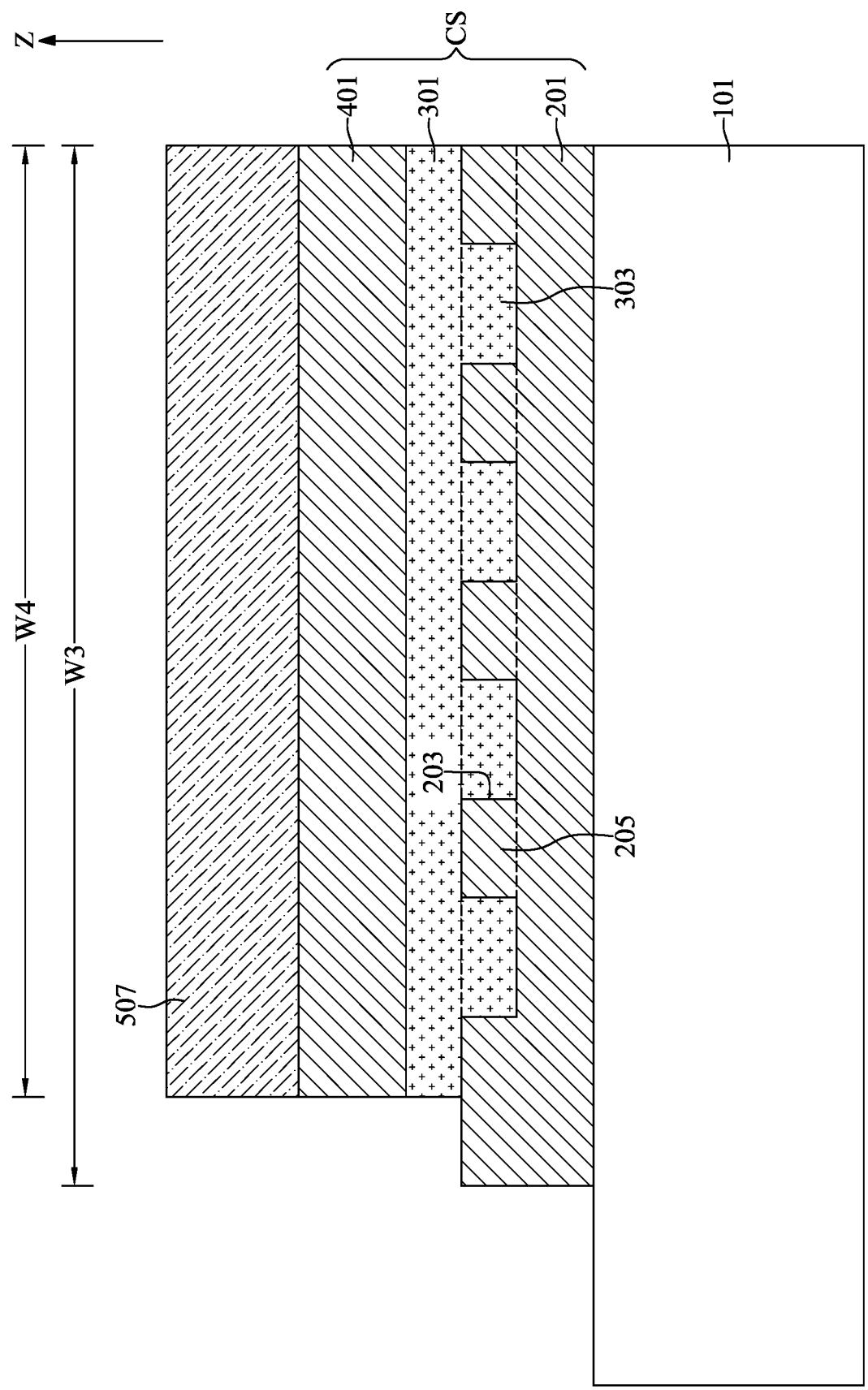

With reference to FIG. 8, a third etch process may be performed using the second mask layer 507 as a pattern guide to remove portions of the top conductive layer 401 and portions of the insulator layer 301. After the third etch process, the top conductive layer 401 and the insulator layer 301 may be trimmed. In other words, the width W3 of the bottom conductive layer 201 may be greater than the width W4 of the insulator layer 301 or the width W4 of the top conductive layer 401.

In some embodiments, the third etch process may be a multistep etch process. In some embodiments, the etch rate ratio of the top conductive layer 401 to the first patterning layer 501 may be between about 100:1 and about 1.05:1, between about 15:1 and about 2:1, or between about 10:1 and about 2:1 during the third etch process. In some embodiments, the etch rate ratio of the insulator layer 301 to the first patterning layer 501 may be between about 100:1 and about 1.05:1, between about 15:1 and about 2:1, or between about 10:1 and about 2:1 during the third etch process. In some embodiments, the etch rate ratio of the insulator layer 301 to the bottom conductive layer 201 may be between about 100:1 and about 1.05:1, between about 15:1 and about 2:1, or between about 10:1 and about 2:1 during the third etch process. In some embodiments, the third etch process may be an anisotropic etch process such as a reactive ion etch process.

In some embodiments, the process temperature of the third etch process may be between about 200° C. and about 550° C. In some embodiments, the process temperature of the third etch process may be between about 300° C. and about 450° C. In some embodiments, the etchant gases of the third etch process may be a mixture of chlorine gas and boron trichloride gas.

After the third etch process, the second mask layer 507 may be removed by an ashing process or other applicable semiconductor process.

The bottom conductive layer 201, the plurality of bottom conductive protrusions 205, the plurality of bottom insulating protrusions 303, the insulator layer 301, and the top conductive layer 401 together configure a capacitor structure CS. The bottom conductive layer 201 and the plurality of bottom conductive protrusions 205 may serve as the bottom electrode of the capacitor structure CS. The insulator layer 301 and the plurality of bottom insulating protrusions 303 may serve as the insulator of the capacitor structure CS. The top conductive layer 401 may serve as the top electrode of the capacitor structure CS.

Figure 9:
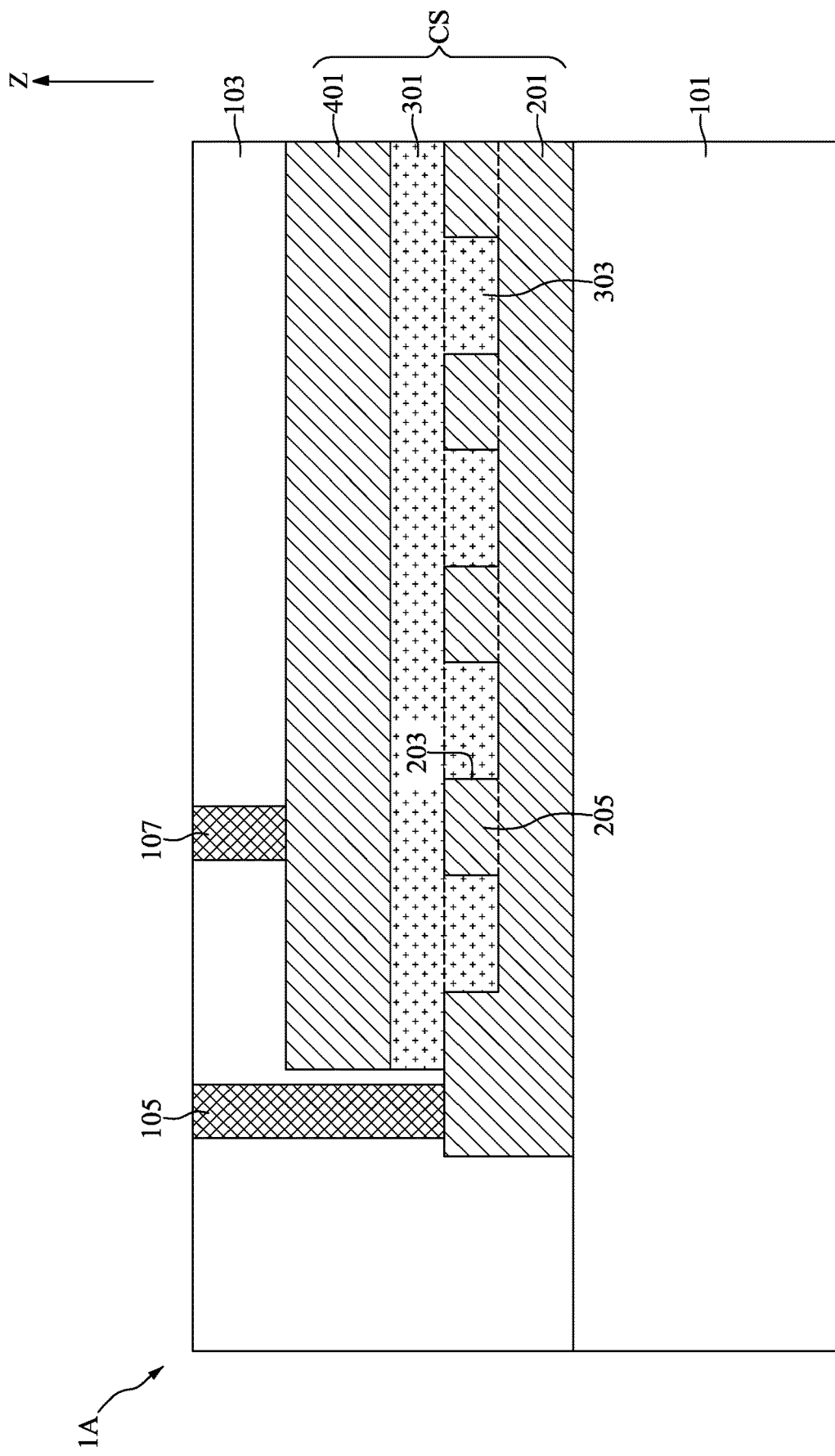

With reference to FIGS. 1 and 9, at step S19, a first contact 105 may be formed on the bottom conductive layer 201, and a second contact 107 may be formed on the top conductive layer 401.

With reference to FIG. 9, an insulating layer 103 may be formed on the substrate 101 and cover the capacitor structure CS. The insulating layer 103 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the insulating layer 103 may include a self-planarizing material such as a spin-on glass or a spin-on low-k dielectric material such as SiLK™ The use of a self-planarizing dielectric material may avoid the need to perform a subsequent planarizing step. In some embodiments, the insulating layer 103 may be formed by a deposition process including, for example, chemical vapor deposition, plasma enhanced chemical vapor deposition, evaporation, or spin-on coating.

In some embodiments, a planarization process, such as chemical mechanical polishing, may be performed on the insulating layer 103 to provide a substantially flat surface for subsequent processing steps.

With reference to FIG. 9, the first contact 105 may be formed in the insulating layer 103 and electrically connected to the bottom conductive layer 201. The first contact 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first contact 105 may be formed by, for example, a damascene method. Generally, in a damascene method, one or more dielectric materials, such as the low-k dielectric materials (i.e., having a dielectric constant (k)<4.0), are deposited and pattern etched to form the vertical interconnects, also known as vias, and horizontal interconnects, also known as lines. Conductive materials, such as copper containing materials, and other materials, such as barrier layer materials used to prevent diffusion of copper containing materials into the surrounding low-k dielectric, are then inlaid into the etched pattern. Any excess copper containing materials and excess barrier layer material-external to the etched pattern, such as on the field of the substrate, is then removed.

With reference to FIG. 9, the second contact 107 may be formed in the insulating layer 103 and electrically connected to the top conductive layer 401. The second contact 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The second contact 107 may be formed by, for example, a damascene method similar to the first contact 105.

The plurality of bottom conductive protrusions 205 and the plurality of bottom insulating protrusions 303 may increase the contact surface between the insulator and the bottom electrode of the capacitor structure CS. Therefore, the capacitance of the capacitor structure CS may be increased. As a result, the performance of the capacitor structure CS may be improved.

Figure 10:
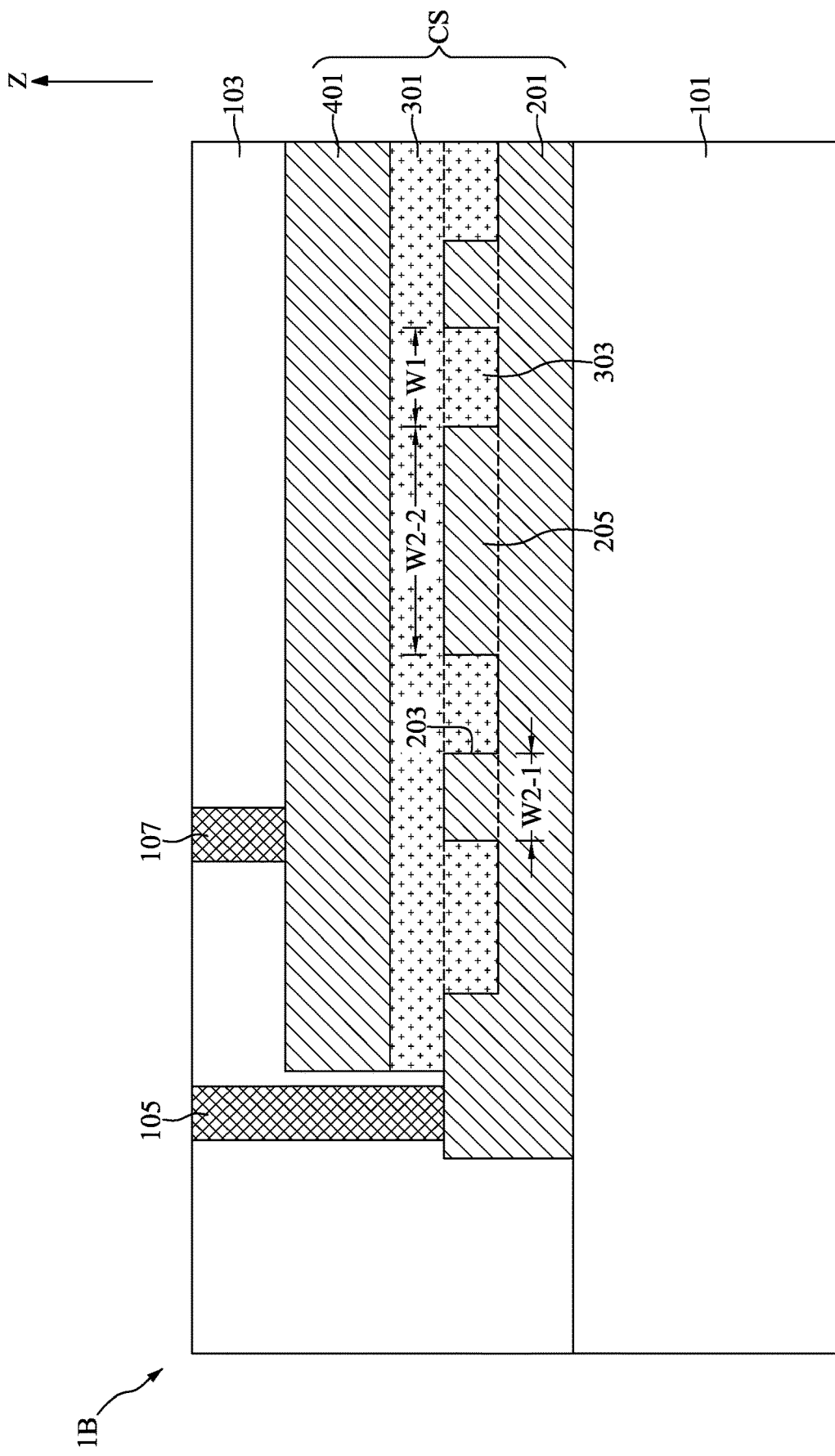
FIG. 10 illustrates, in a schematic cross-sectional view diagram, a semiconductor device in accordance with one embodiment of the present disclosure.

FIG. 10 illustrates, in a schematic cross-sectional view diagram, a semiconductor device 1B in accordance with one embodiment of the present disclosure.

With reference to FIG. 10, the semiconductor device 1B may have a structure similar to that illustrated in FIG. 9. The same or similar elements in FIG. 10 as in FIG. 9 have been marked with similar reference numbers and duplicative descriptions have been omitted.

With reference to FIG. 10, the plurality of bottom conductive protrusions 205 may have multiple widths W2-1, W2-2. The width W2-1 of some of the bottom conductive protrusions 205 and the width W1 of the bottom insulating protrusion 303 may be substantially the same. The width W2-2 of others of the bottom conductive protrusions 205 may be different from the width W1 of the bottom insulating protrusion 303.

FIGS. 11 to 16 illustrate, in schematic cross-sectional view diagrams, a flow for fabricating a semiconductor device 1C in accordance with another embodiment of the present disclosure.

Figure 11:
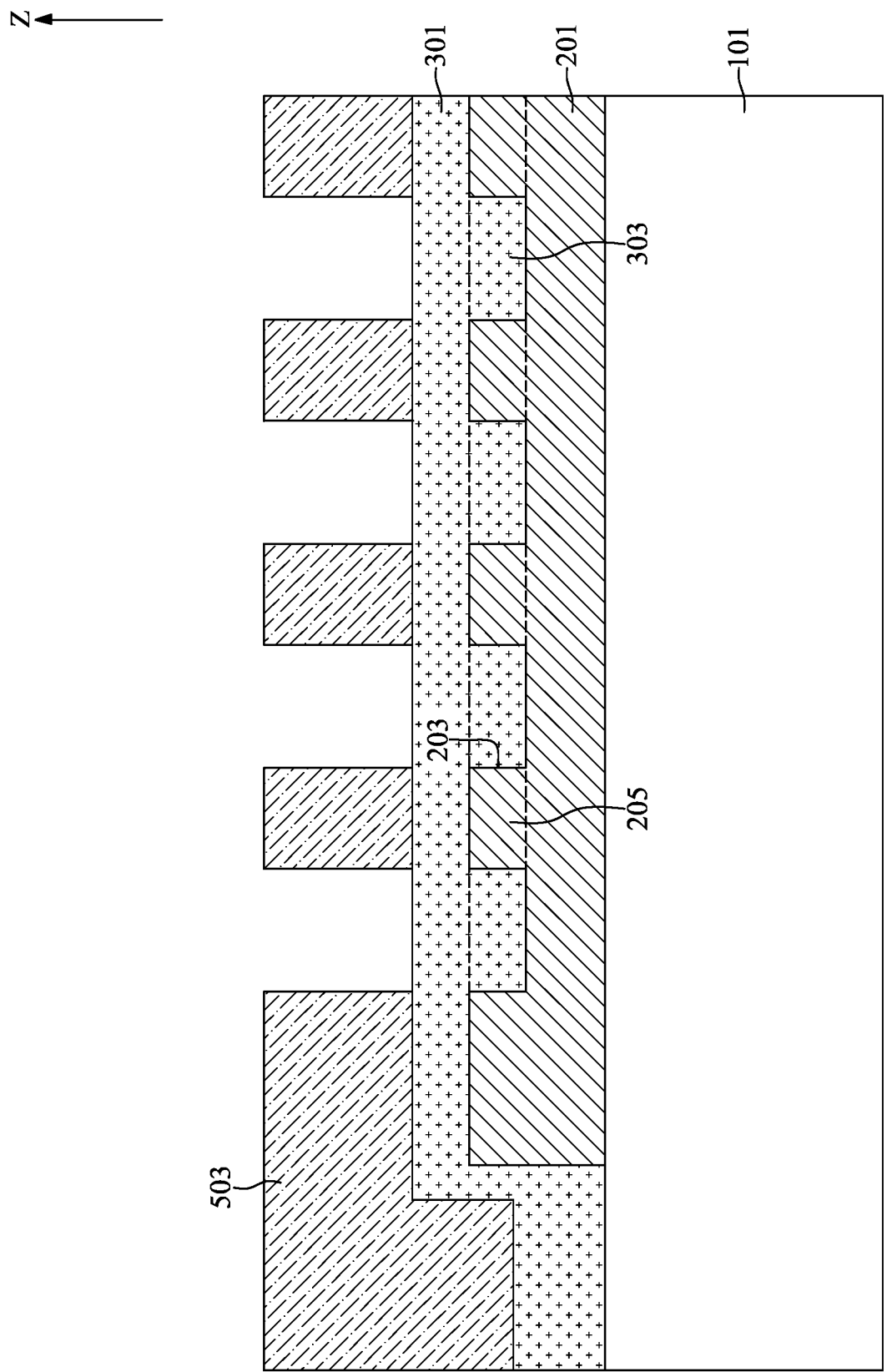
FIGS. 11 to 16 illustrate, in schematic cross-sectional view diagrams, a flow for fabricating a semiconductor device in accordance with another embodiment of the present disclosure.

With reference to FIG. 11, an intermediate semiconductor device may be fabricated with a procedure similar to that illustrated in FIGS. 2 to 5. After the insulator layer 301 is formed, a second patterning layer 503 may be formed on the insulator layer 301. The second patterning layer 503 may include the pattern of a plurality of top recesses 307 which will be illustrated later. In some embodiments, the second patterning layer 503 may be a photoresist layer. In some embodiments, the second patterning layer 503 may be a hard mask layer. The hard mask layer may be formed of, for example, silicon oxide, silicon nitride, silicon oxynitride, silicon nitride oxide, boron nitride, the like, or other applicable dielectric materials.

Figure 12:
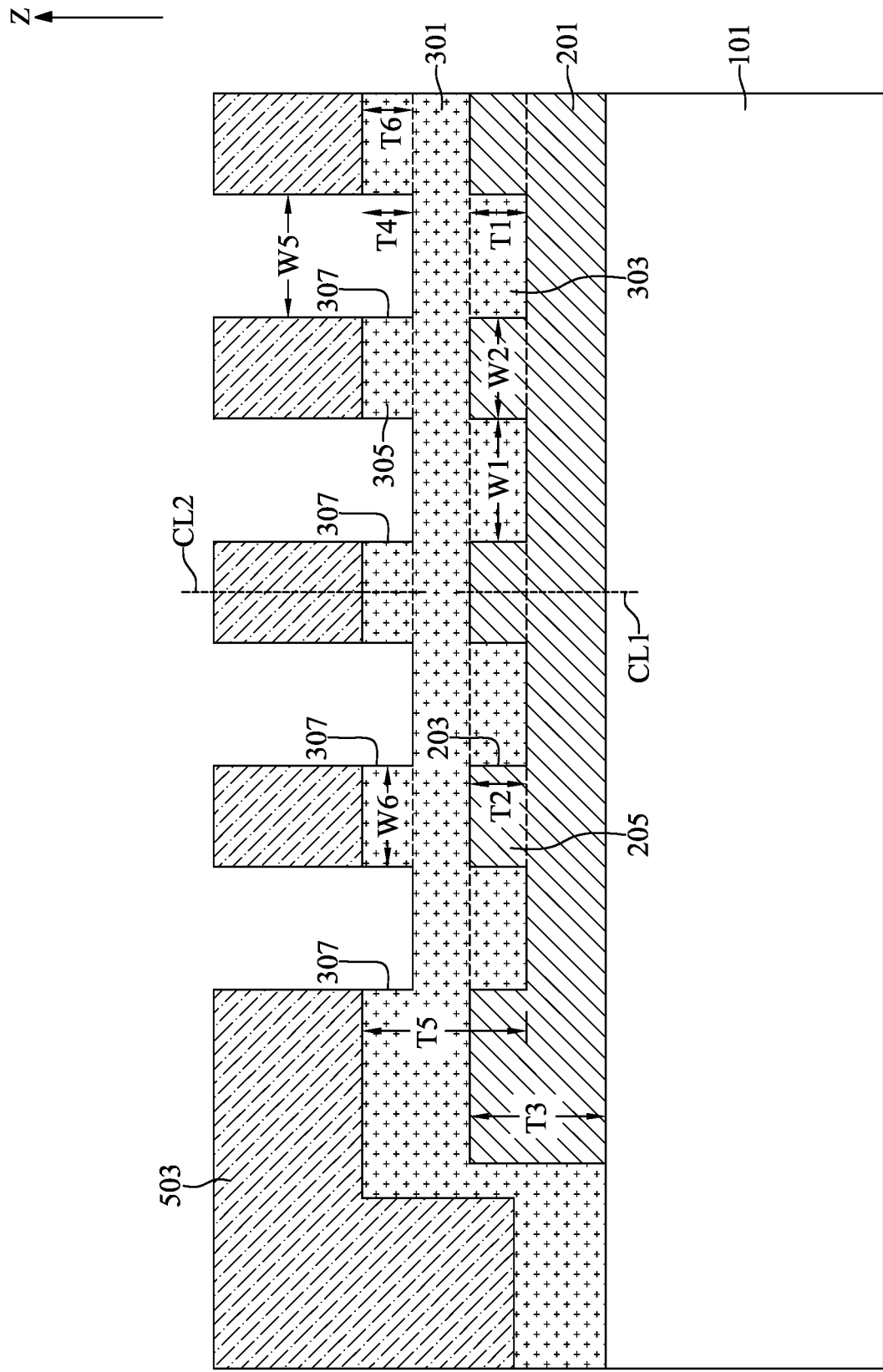

With reference to FIG. 12, a fourth etch process may be performed using the second patterning layer 503 as a pattern guide to remove portions of the insulator layer 301. After the fourth etch process, the plurality of top recesses 307 may be formed. The remaining protrusions of the insulator layer 301 adjacent to the plurality of top recesses 307 may be referred to as a plurality of top insulating protrusions 305. The plurality of top recesses 307 and the plurality of top insulating protrusions 305 may be alternatively arranged along the direction perpendicular to the direction Z and arranged at the upper portion of the insulator layer 301.

In some embodiments, the etch rate ratio of the insulator layer 301 to the second patterning layer 503 may be between about 100:1 and about 1.05:1, between about 15:1 and about 2:1, or between about and about 2:1 during the fourth etch process. In some embodiments, the end point of the fourth etch process may be determined by a fixed etch time. In some embodiments, the fourth etch process may be an anisotropic etch process such as a reactive ion etch process. In some embodiments, the fourth etch process may be an isotropic etch process such as a wet etch process.

After the fourth etch process, the second patterning layer 503 may be removed by an ashing process or other applicable semiconductor process.

In some embodiments, the sidewalls of the plurality of top recesses 307 (i.e., the sidewalls of the plurality of top insulating protrusions 305) may be substantially flat when the fourth etch process is an anisotropic etch process. In some embodiments, the bottom surfaces of the plurality of top recesses 307 may be substantially flat when the fourth etch process is an anisotropic etch process. In some embodiments, the sidewalls of the plurality of top recesses 307 (i.e., the sidewalls of the plurality of top insulating protrusions 305) may be rounding when the fourth etch process is an isotropic etch process. In some embodiments, the bottom surfaces of the plurality of top recesses 307 may be concave when the fourth etch process is an isotropic etch process.

For brevity, clarity, and convenience of description, only one top recess 307 and one top insulating protrusion 305 are described. In some embodiments, the width W5 of the top recess 307 and the width W6 of the top insulating protrusion 305 may be substantially the same. In some embodiments, the ratio of the thickness T4 of the top recess 307 to the thickness T5 of the insulator layer 301 may be between about 8:1 and about 1:1, between about 5:1 and about 1:1, or between about 3:1 and about 1:1. In some embodiments, the ratio of the thickness T6 of the top insulating protrusion 305 to the thickness T5 of the insulator layer 301 may be between about 8:1 and about 1:1, between about 5:1 and about 1:1, or between about 3:1 and about 1:1.

In some embodiments, the width W5 of the top recess 307 and the width W1 of the bottom insulating protrusion 303 may be substantially the same. In some embodiments, the width W5 of the top recess 307 and the width W1 of the bottom insulating protrusion 303 may be different. In some embodiments, the width W5 of the top recess 307 and the width W2 of the bottom conductive protrusion 205 may be substantially the same. In some embodiments, the width W5 of the top recess 307 and the width W2 of the bottom conductive protrusion 205 may be different. In some embodiments, the width W6 of the top insulating protrusion 305 and the width W2 of the bottom conductive protrusion 205 may be substantially the same. In some embodiments, the width W6 of the top insulating protrusion 305 and the width W2 of the bottom conductive protrusion 205 may be different. In some embodiments, the width W6 of the top insulating protrusion 305 and the width W1 of the bottom insulating protrusion 303 may be substantially the same. In some embodiments, the width W6 of the top insulating protrusion 305 and the width W1 of the bottom insulating protrusion 303 may be different.

In some embodiments, the thickness T4 of the top recess 307 and the thickness T1 of the bottom insulating protrusion 303 may be substantially the same. In some embodiments, the thickness T4 of the top recess 307 and the thickness T1 of the bottom insulating protrusion 303 may be different. In some embodiments, the thickness T4 of the top recess 307 and the thickness T2 of the bottom conductive protrusion 205 may be substantially the same. In some embodiments, the thickness T4 of the top recess 307 and the thickness T2 of the bottom conductive protrusion 205 may be different. In some embodiments, the thickness T6 of the top insulating protrusion 305 and the thickness T2 of the bottom conductive protrusion 205 may be substantially the same. In some embodiments, the thickness T6 of the top insulating protrusion 305 and the thickness T2 of the bottom conductive protrusion 205 may be different. In some embodiments, the thickness T6 of the top insulating protrusion 305 and the thickness T1 of the bottom insulating protrusion 303 may be substantially the same.

In some embodiments, the thickness T6 of the top insulating protrusion 305 and the thickness T1 of the bottom insulating protrusion 303 may be different.

In some embodiments, the center line CL1 of the bottom conductive protrusion 205 and the center line CL2 of the top insulating protrusion 305 may be aligned to each other along the direction Z.

Figure 13:
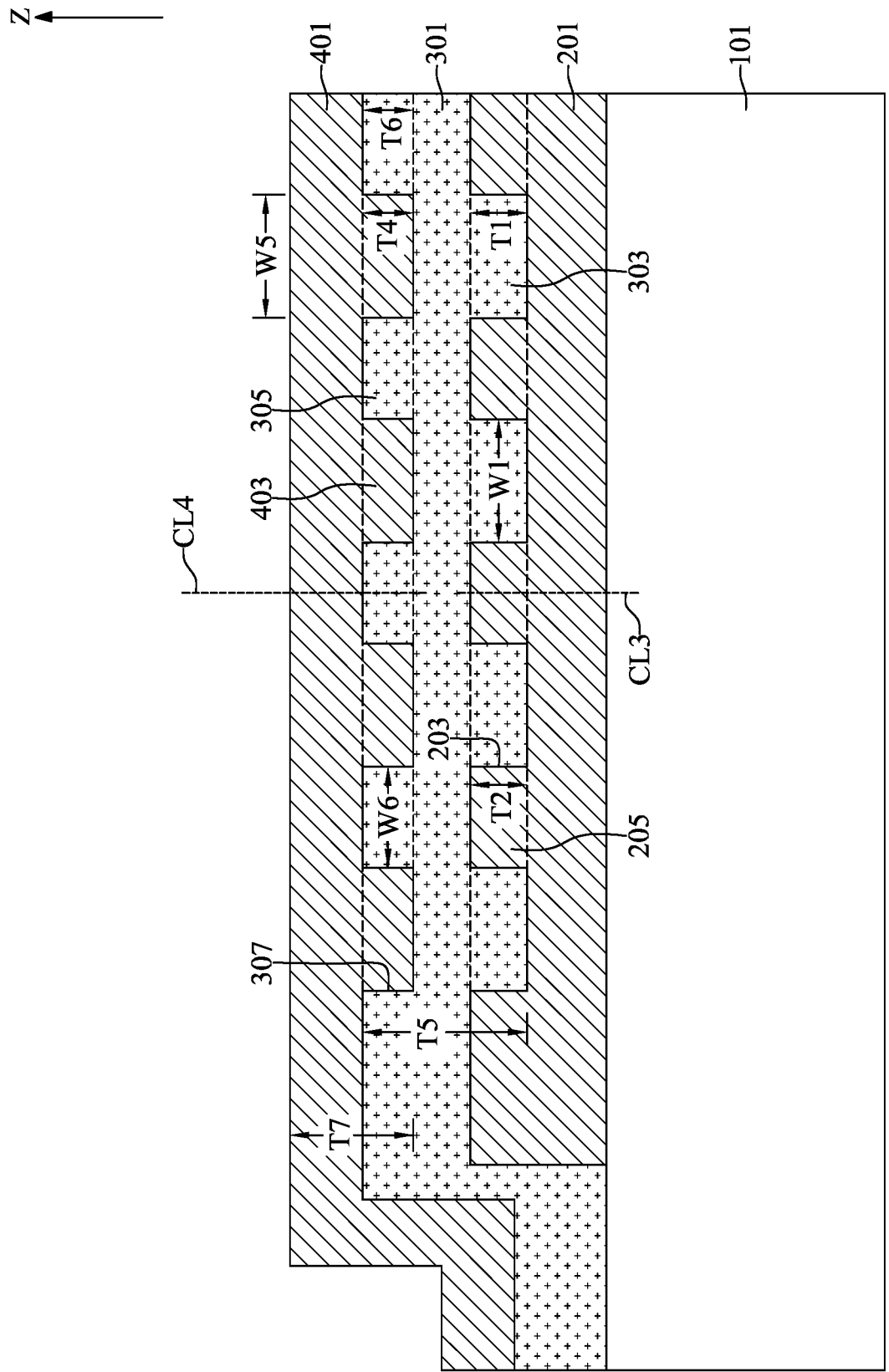

With reference to FIG. 13, the top conductive layer 401 may be conformally formed on the insulator layer 301, on the plurality of top insulating protrusions 305, and completely filling the plurality of top recesses 307. The portions of the top conductive layer 401 filling the plurality of top recesses 307 may be referred to as a plurality of top conductive protrusions 403. For brevity, clarity, and convenience of description, only one top conductive protrusion 403 is described. In some embodiments, the top conductive layer 401 and the top conductive protrusion 403 may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The top conductive layer 401 and the top conductive protrusion 403 may be formed by, for example, chemical vapor deposition, physical vapor deposition, sputtering, the like, or other applicable deposition process.

In some embodiments, a planarization process, such as chemical mechanical polishing, may be performed on the top conductive layer 401 to provide a substantially flat surface for subsequent processing steps.

In some embodiments, the dimension and shape of the top conductive protrusion 403 is determined by the top recess 307; therefor, the top conductive protrusion 403 has the same width W5 and the same thickness T4. In some embodiments, the width W5 of the top conductive protrusion 403 and the width W6 of the top insulating protrusion 305 may be substantially the same. In some embodiments, the ratio of the thickness T4 of the bottom insulating protrusion 303 to the thickness T7 of the top conductive layer 401 may be between about 1:3 and about 1:30, between about 1:4 and about 1:25, or between about 1:5 and about 1:20.

In some embodiments, the width W5 of the top conductive protrusion 403 and the width W1 of the bottom insulating protrusion 303 may be substantially the same. In some embodiments, the width W5 of the top conductive protrusion 403 and the width W1 of the bottom insulating protrusion 303 may be different. In some embodiments, the width W5 of the top conductive protrusion 403 and the width W2 of the bottom conductive protrusion 205 may be substantially the same. In some embodiments, the width W5 of the top conductive protrusion 403 and the width W2 of the bottom conductive protrusion 205 may be different.

In some embodiments, the thickness T4 of the top conductive protrusion 403 and the thickness T1 of the bottom insulating protrusion 303 may be substantially the same. In some embodiments, the thickness T4 of the top conductive protrusion 403 and the thickness T1 of the bottom insulating protrusion 303 may be different. In some embodiments, the thickness T4 of the top conductive protrusion 403 and the thickness T2 of the bottom conductive protrusion 205 may be substantially the same. In some embodiments, the thickness T4 of the top conductive protrusion 403 and the thickness T2 of the bottom conductive protrusion 205 may be different.

In some embodiments, the center line CL3 of the bottom insulating protrusion 303 and the center line CL4 of the top conductive protrusion 403 may be aligned to each other along the direction Z.

Figure 14:
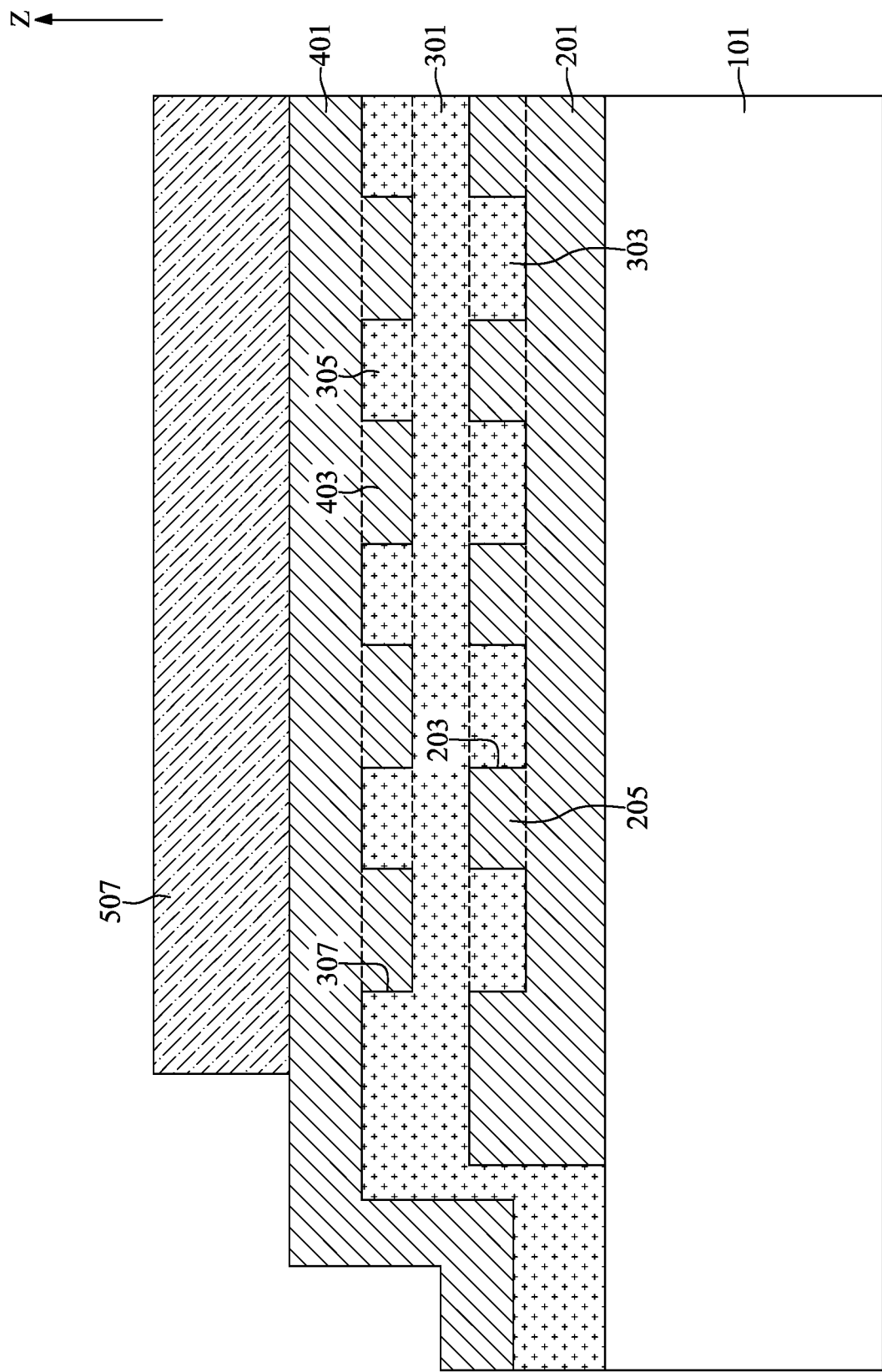

With reference to FIG. 14, the second mask layer 507 may be formed on the top conductive layer 401 with a procedure similar to that illustrated in FIG. 7, and descriptions thereof are not repeated herein.

Figure 15:
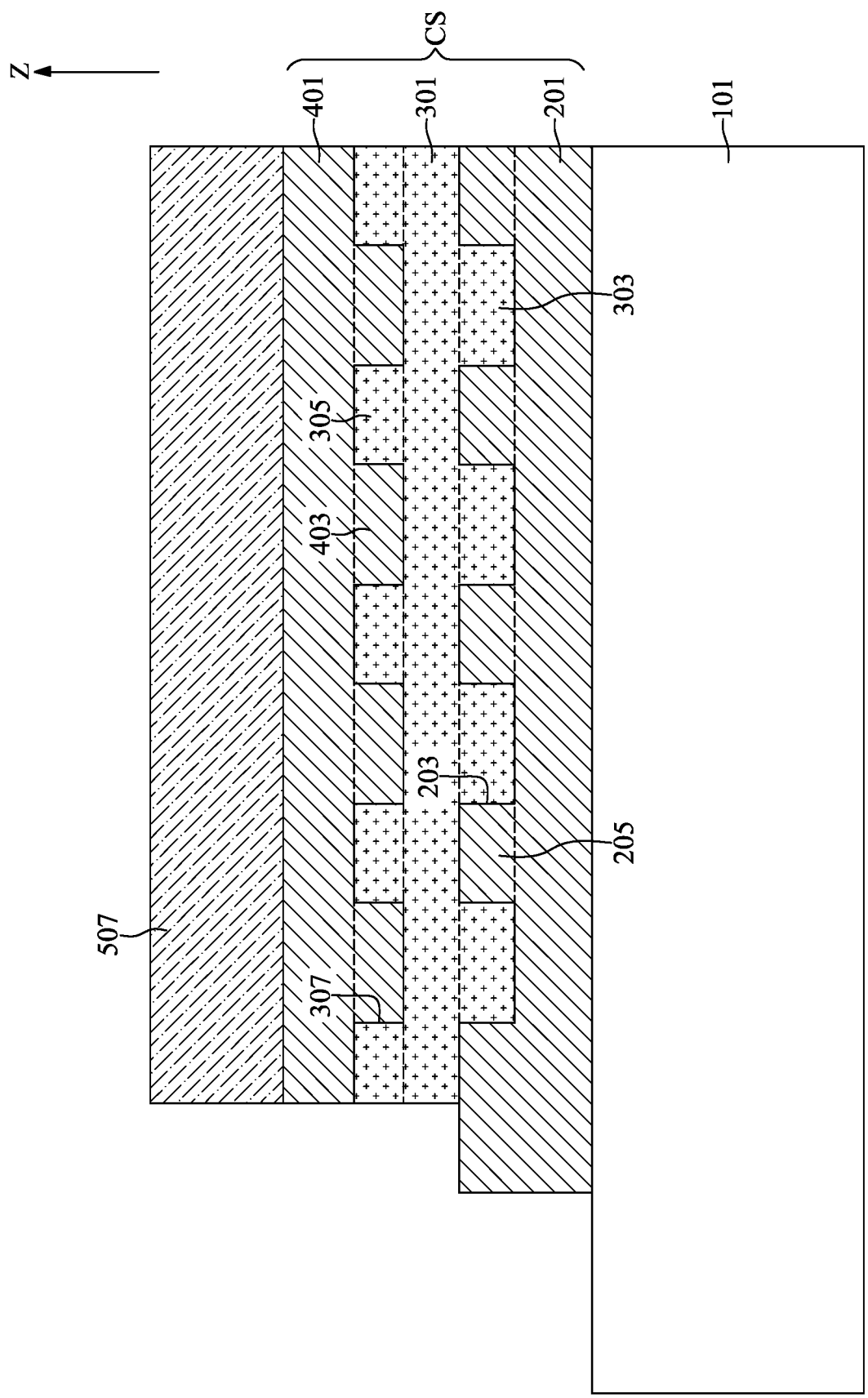

With reference to FIG. 15, the third etch process may be performed with a procedure similar to that illustrated in FIG. 8, and descriptions thereof are not repeated herein. After the third etch process, the second mask layer 507 may be removed by an ashing process or other applicable semiconductor process.

The bottom conductive layer 201, the plurality of bottom conductive protrusions 205, the plurality of bottom insulating protrusions 303, the insulator layer 301, the plurality of top insulating protrusions 305, the top conductive layer 401, and the plurality of top conductive protrusions 403 together configure a capacitor structure CS. The bottom conductive layer 201 and the plurality of bottom conductive protrusions 205 may serve as the bottom electrode of the capacitor structure CS. The insulator layer 301, the plurality of bottom insulating protrusions 303, and the plurality of top insulating protrusions 305 may serve as the insulator of the capacitor structure CS. The top conductive layer 401 and the plurality of top conductive protrusions 403 may serve as the top electrode of the capacitor structure CS.

Figure 16:
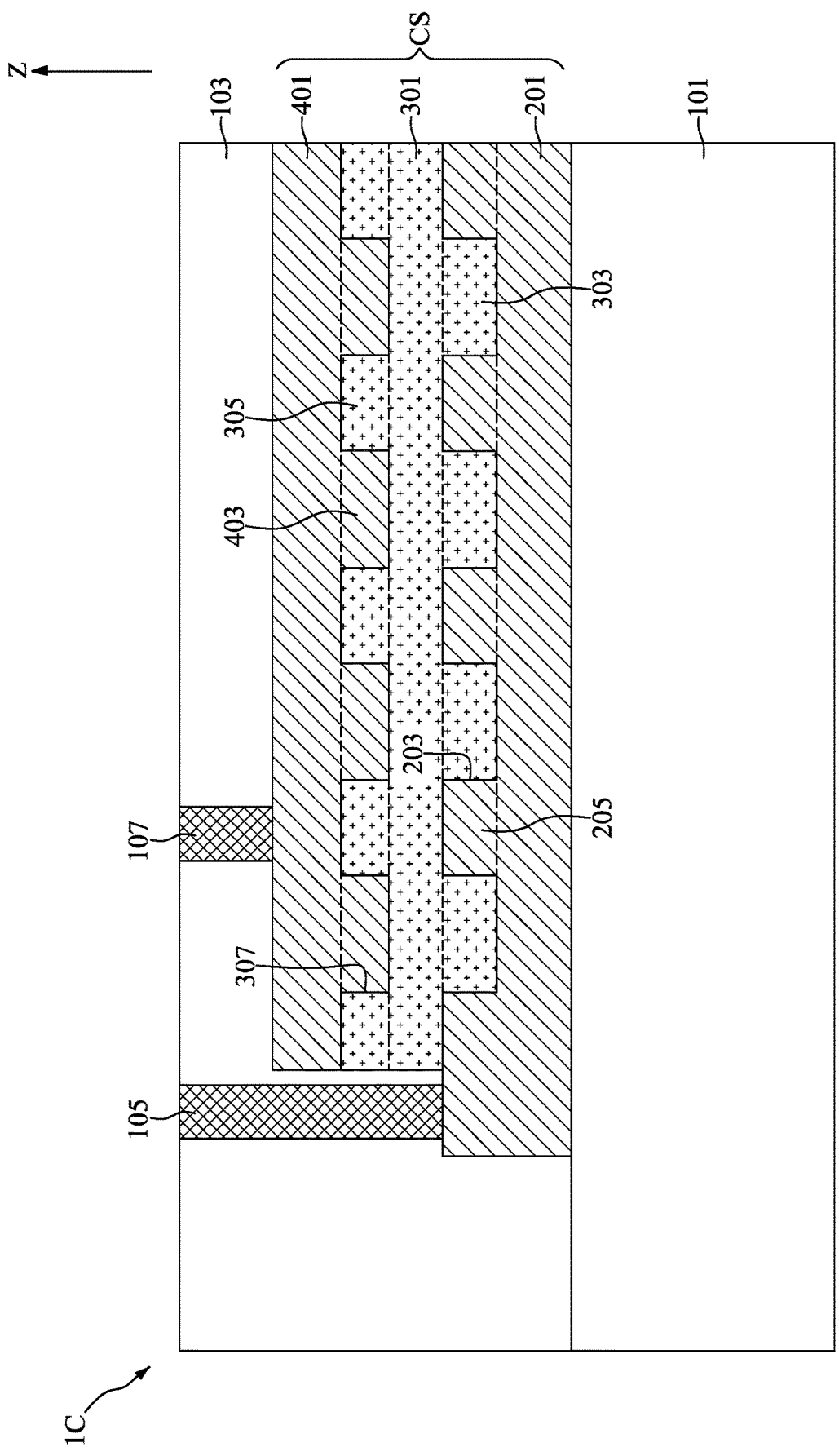

With reference to FIG. 16, the insulating layer 103, the first contact 105, and the second contact 107 may be formed with a procedure similar to that illustrated in FIG. 9, and descriptions thereof are not repeated herein.

The plurality of bottom conductive protrusions 205 and the plurality of bottom insulating protrusions 303 may increase the contact surface between the insulator and the bottom electrode of the capacitor structure CS, and the plurality of top insulating protrusions 305 and the plurality of top conductive protrusions 403 may increase the contact surface between the insulator and the top electrode of the capacitor structure CS. Therefore, the capacitance of the capacitor structure CS may be increased. As a result, the performance of the capacitor structure CS may be improved.

FIGS. 17 to 21 illustrate, in schematic cross-sectional view diagrams, semiconductor devices 1D, 1E, IF, 1G, and 1H in accordance with some embodiments of the present disclosure.

Figure 17:
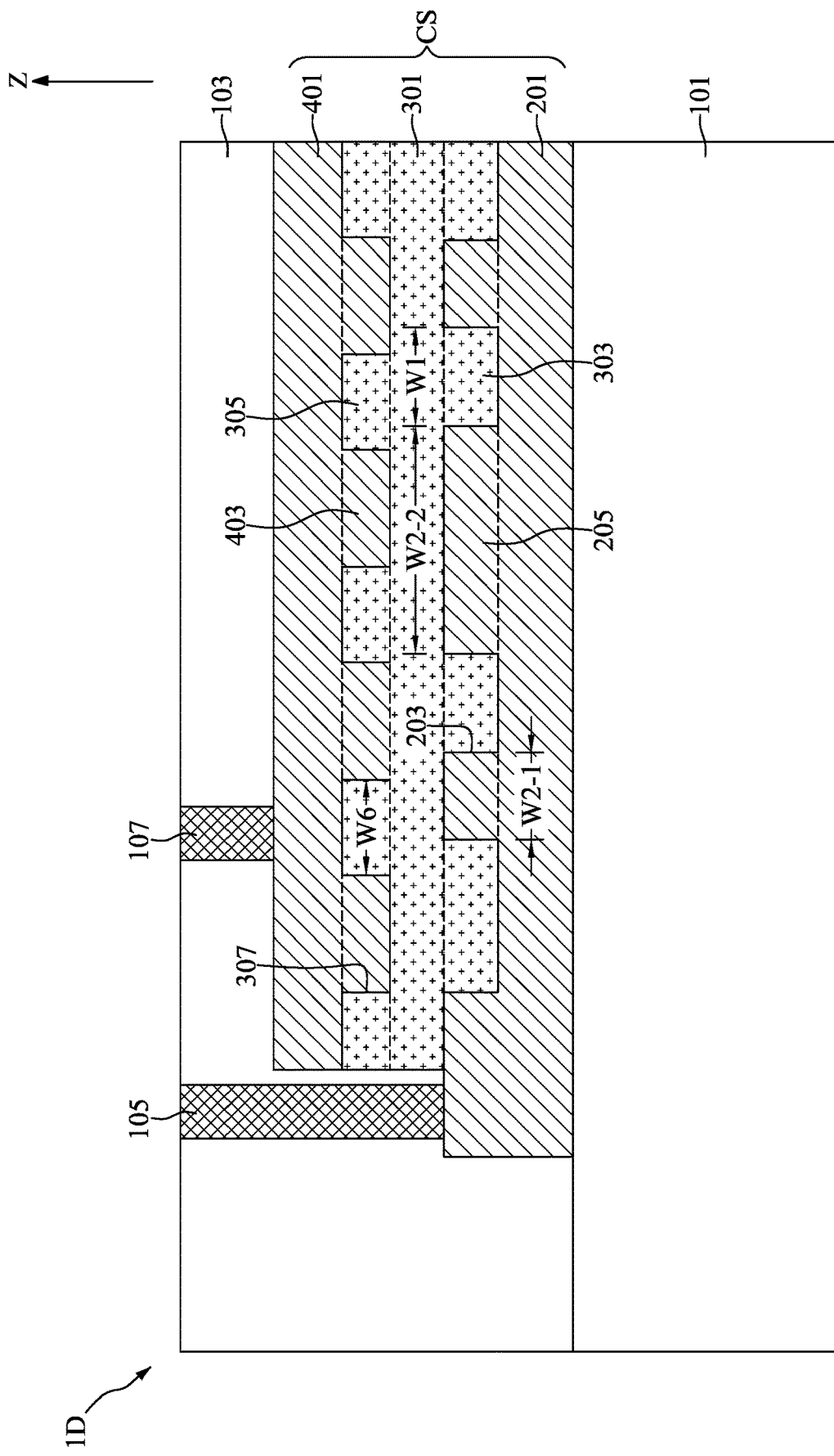
FIGS. 17 to 21 illustrate, in schematic cross-sectional view diagrams, semiconductor devices in accordance with some embodiments of the present disclosure.

With reference to FIG. 17, the semiconductor device 1D may have a structure similar to that illustrated in FIG. 16. The same or similar elements in FIG. 17 as in FIG. 16 have been marked with similar reference numbers and duplicative descriptions have been omitted.

With reference to FIG. 17, the plurality of bottom conductive protrusions 205 may have multiple widths W2-1, W2-2. The width W2-1 of some of the bottom conductive protrusions 205 and the width W1 of the bottom insulating protrusion 303 may be substantially the same. The width W2-2 of others of the bottom conductive protrusions 205 may be different from the width W1 of the bottom insulating protrusion 303.

Figure 18:
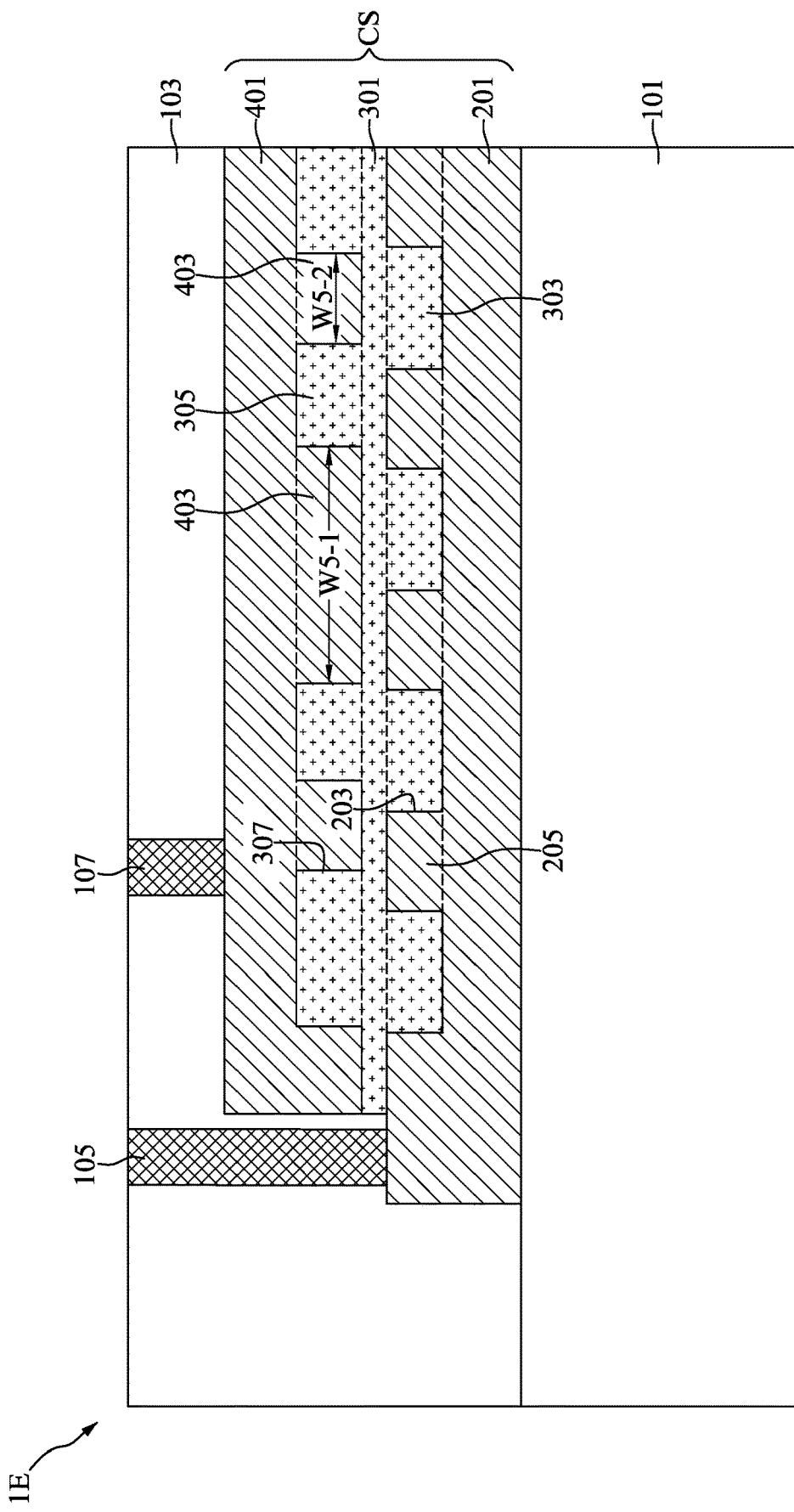

With reference to FIG. 18, the semiconductor device 1E may have a structure similar to that illustrated in FIG. 16. The same or similar elements in FIG. 18 as in FIG. 16 have been marked with similar reference numbers and duplicative descriptions have been omitted.

With reference to FIG. 18, the plurality of top conductive protrusions 403 may have multiple widths W5-1, W5-2. The width W5-1 of some of the plurality of top conductive protrusions 403 and the width W6 of the top insulating protrusion 305 may be different. The width W5-2 of others of the plurality of top conductive protrusions 403 and the width W6 of the top insulating protrusion 305 may be substantially the same.

Figure 19:
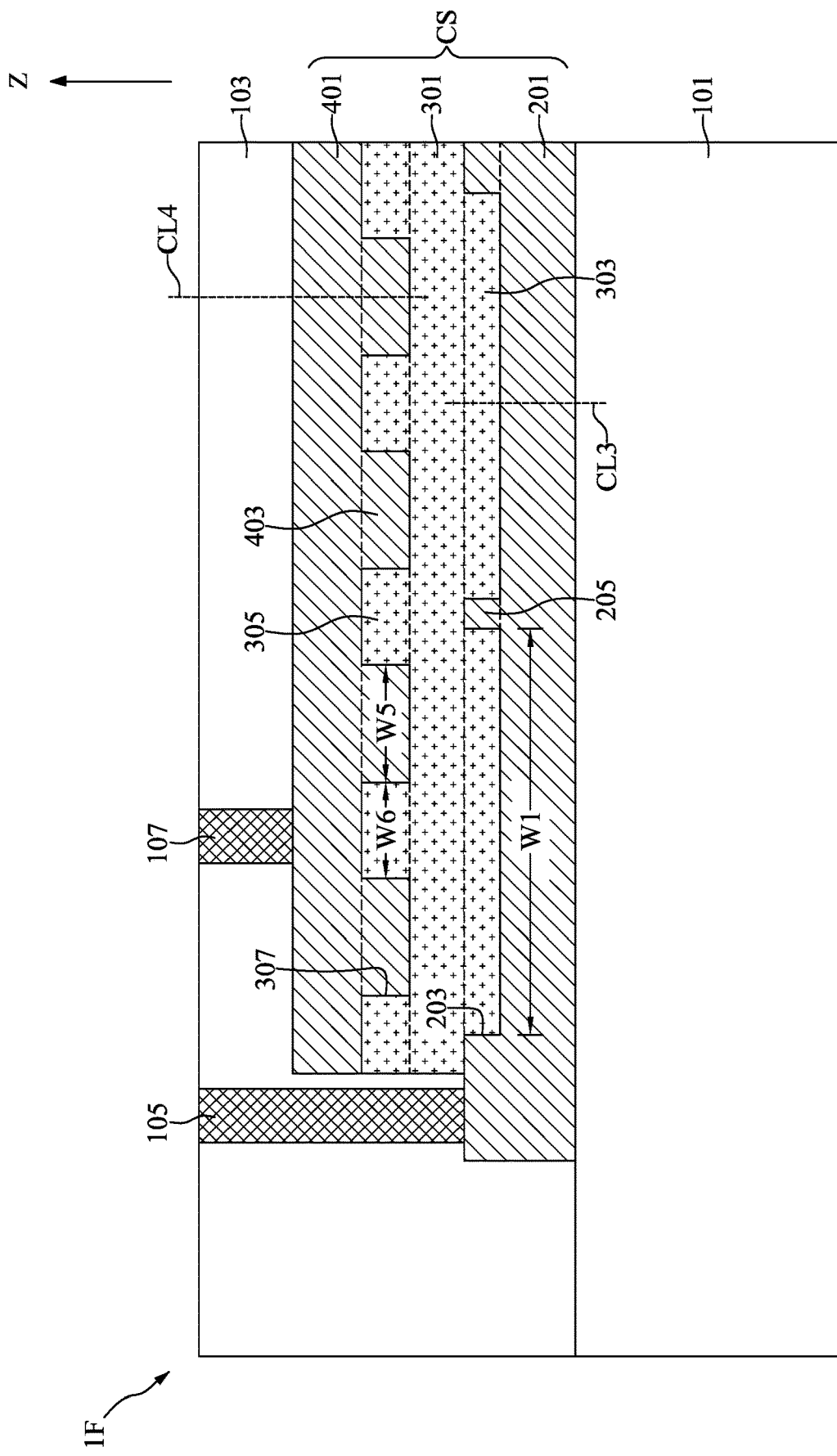

With reference to FIG. 19, the semiconductor device IF may have a structure similar to that illustrated in FIG. 16. The same or similar elements in FIG. 19 as in FIG. 16 have been marked with similar reference numbers and duplicative descriptions have been omitted.

With reference to FIG. 19, the width W1 of the bottom insulating protrusion 303 may be greater than the width W5 of the top conductive protrusion 403 or the width W6 of the top insulating protrusion 305. In some embodiments, the width W1 of the bottom insulating protrusion 303 may be greater than the sum of the width W5 of the top conductive protrusion 403 and the width W6 of the top insulating protrusion 305. The center line CL3 of the bottom insulating protrusion 303 and the center line CL4 of the top conductive protrusion 403 may be mis-aligned to each other along the direction Z.

Figure 20:
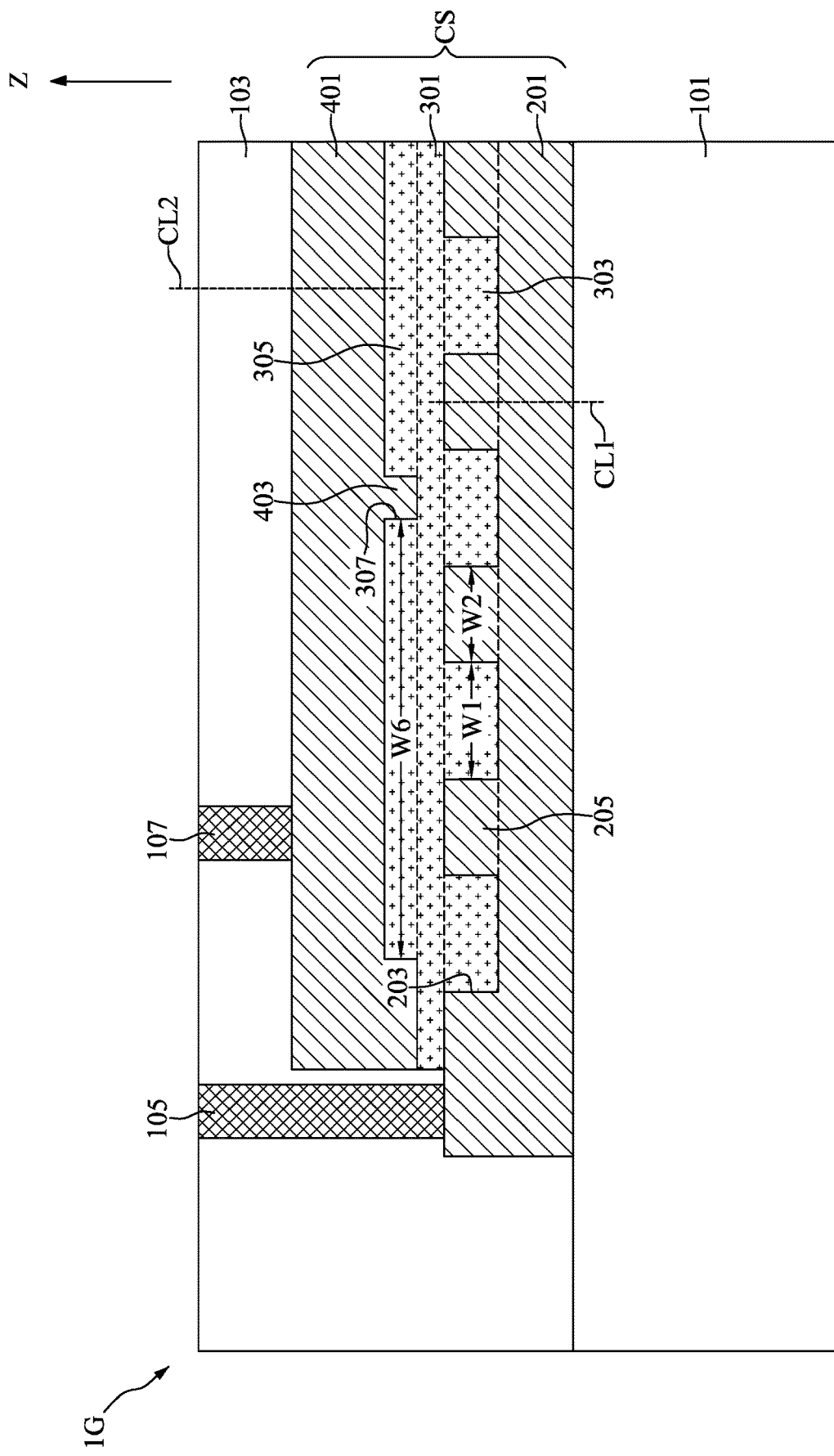

With reference to FIG. 20, the semiconductor device 1G may have a structure similar to that illustrated in FIG. 16. The same or similar elements in FIG. 20 as in FIG. 16 have been marked with similar reference numbers and duplicative descriptions have been omitted.

With reference to FIG. 20, the width W6 of the top insulating protrusion 305 may be greater than the width W1 of the bottom insulating protrusion 303 or the width W2 of the bottom conductive protrusion 205. In some embodiments, the width W6 of the top insulating protrusion 305 may be greater than the sum of the width W1 of the bottom insulating protrusion 303 and the width W2 of the bottom conductive protrusion 205. The center line CL1 of the bottom conductive protrusion 205 and the center line CL2 of the top insulating protrusion 305 may be mis-aligned to each other along the direction Z.

Figure 21:
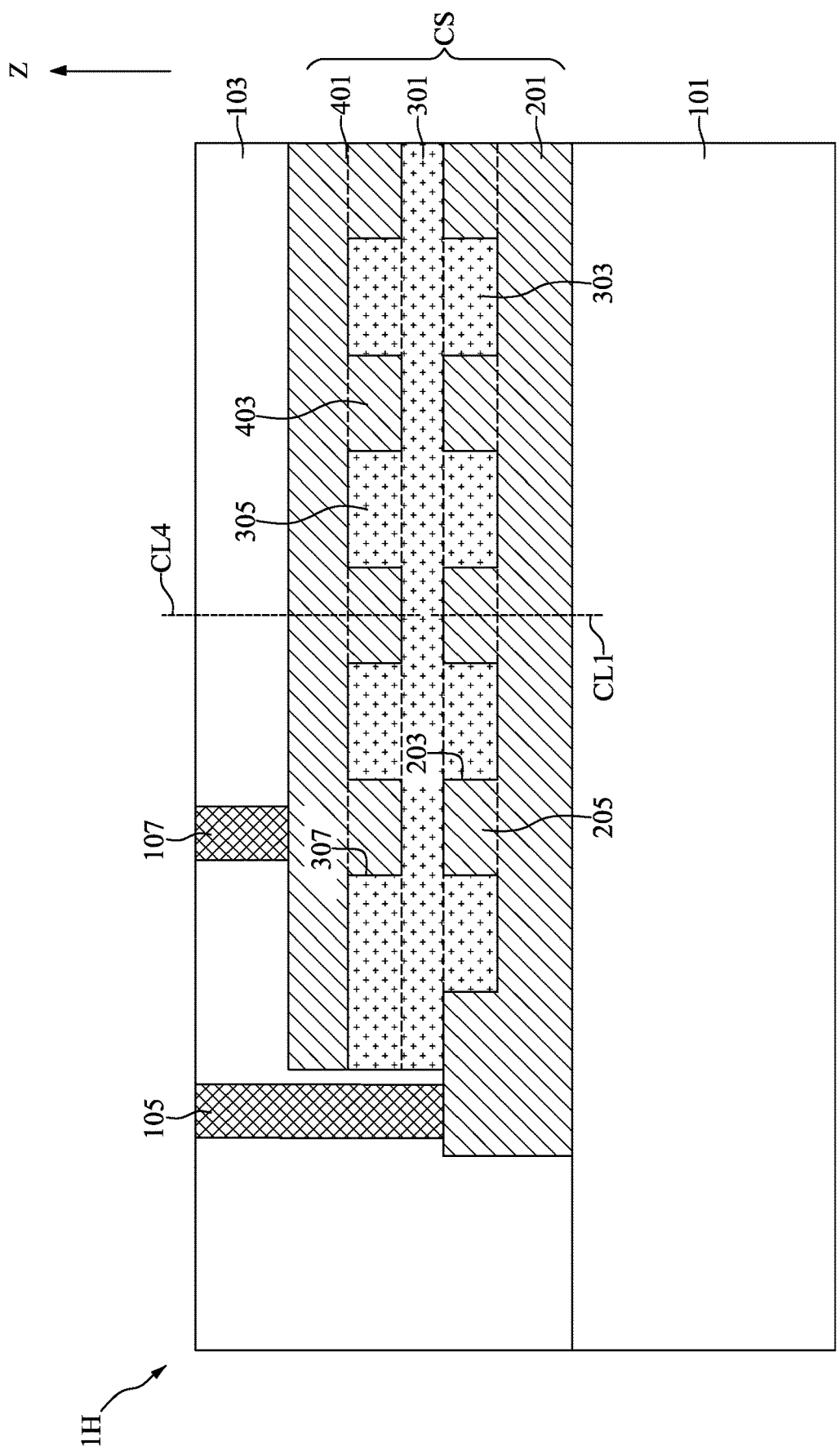

With reference to FIG. 21, the semiconductor device 1H may have a structure similar to that illustrated in FIG. 16. The same or similar elements in FIG. 21 as in FIG. 16 have been marked with similar reference numbers and duplicative descriptions have been omitted.

With reference to FIG. 21, the center line CL1 of the bottom conductive protrusion 205 and the center line CL4 of the top conductive protrusion 403 may be aligned to each other along the direction Z.

One aspect of the present disclosure provides a semiconductor device including a substrate; a bottom conductive layer positioned on the substrate; at least one bottom conductive protrusion positioned on the bottom conductive layer; an insulator layer positioned on the bottom conductive layer and the at least one bottom conductive protrusion; at least one bottom insulating protrusion protruding from the insulator layer towards the bottom conductive layer and adjacent to the at least one bottom conductive protrusion; and a top conductive layer positioned on the insulator layer. The bottom conductive layer, the at least one bottom conductive protrusion, the insulator layer, the at least one bottom insulating protrusion, and the top conductive layer together configure a capacitor structure.

Another aspect of the present disclosure provides a semiconductor device including a substrate; a bottom conductive layer positioned on the substrate; at least one bottom conductive protrusion positioned on the bottom conductive layer; an insulator layer positioned on the bottom conductive layer and the at least one bottom conductive protrusion; at least one bottom insulating protrusion protruding from the insulator layer towards the bottom conductive layer and adjacent to the at least one bottom conductive protrusion; at least one top insulating protrusion positioned on the insulator layer; a top conductive layer positioned on the insulator layer and the at least one top insulating protrusion; and at least one top conductive protrusion protruding from the top conductive layer towards the insulator layer and adjacent to the at least one top insulating protrusion. The bottom conductive layer, the at least one bottom conductive protrusion, the insulator layer, the at least one bottom insulating protrusion, the at least one top insulating protrusion, the top conductive layer, and the at least one top conductive protrusion together configure a capacitor structure.

Another aspect of the present disclosure provides a method for fabricating a semiconductor device including providing a substrate; forming a bottom conductive layer on the substrate; patterning the bottom conductive layer to form at least one bottom conductive protrusion and at least one bottom recess adjacent to the bottom conductive protrusion; forming an insulator layer on the bottom conductive layer and on the at least one bottom conductive protrusion, and forming at least one bottom insulating protrusion filling the at least one bottom recess; and forming a top conductive layer on the insulator layer. The bottom conductive layer, the at least one bottom conductive protrusion, the insulator layer, the at least one bottom insulating protrusion, and the top conductive layer together configure a capacitor structure.

Another aspect of the present disclosure provides a method for fabricating a semiconductor device including providing a substrate; forming a bottom conductive layer on the substrate; patterning the bottom conductive layer to form at least one bottom conductive protrusion and at least one bottom recess adjacent to the bottom conductive protrusion; forming an insulator layer on the bottom conductive layer and on the at least one bottom conductive protrusion, and forming at least one bottom insulating protrusion filling the at least one bottom recess; patterning the insulator layer to form at least one top insulating protrusion and at least one top recess adjacent to the top insulating protrusion; forming a top conductive layer on the insulator layer and on the at least one top insulating protrusion, and forming at least one top conductive protrusion filling the at least one top recess. The bottom conductive layer, the at least one bottom conductive protrusion, the insulator layer, the at least one bottom insulating protrusion, the at least one top insulating protrusion, the top conductive layer, and the at least one top conductive protrusion together configure a capacitor structure.

Due to the design of the semiconductor device of the present disclosure, the plurality of bottom conductive protrusions 205 and the plurality of bottom insulating protrusions 303 may increase the contact surface between the insulator and the bottom electrode of the capacitor structure CS, and the plurality of top insulating protrusions 305 and the plurality of top conductive protrusions 403 may increase the contact surface between the insulator and the top electrode of the capacitor structure CS. Therefore, the capacitance of the capacitor structure CS may be increased. As a result, the performance of the capacitor structure CS as well as the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a bottom conductive layer positioned on the substrate;
at least one bottom conductive protrusion positioned on the bottom conductive layer;
an insulator layer positioned on the bottom conductive layer and the at least one bottom conductive protrusion;
at least one bottom insulating protrusion protruding from the insulator layer towards the bottom conductive layer and adjacent to the at least one bottom conductive protrusion; and
a top conductive layer positioned on the insulator layer;
wherein the bottom conductive layer, the at least one bottom conductive protrusion, the insulator layer, the at least one bottom insulating protrusion, and the top conductive layer together configure a capacitor structure, wherein a width of the bottom conductive layer is greater than a width of the insulator layer.

2. The semiconductor device of claim 1, wherein a width of the at least one bottom conductive protrusion and a width of the at least one bottom insulating protrusion are substantially the same.

3. The semiconductor device of claim 1, wherein a width of the at least one bottom conductive protrusion and a width of the at least one bottom insulating protrusion are different.

4. The semiconductor device of claim 1, further comprising a first contact electrically coupled to the bottom conductive layer.

5. The semiconductor device of claim 4, further comprising second contact positioned on the top conductive layer and electrically coupled to the top conductive layer.

6. The semiconductor device of claim 1, wherein a ratio of a thickness of the bottom conductive protrusion to a thickness of the bottom conductive layer is between about 1:5 and about 1:20.

7. The semiconductor device of claim 1, wherein a ratio of a thickness of the bottom insulating protrusion to a thickness of the insulator layer is between about 1:1 and about 3:1.

8. A semiconductor device, comprising:
a substrate;
a bottom conductive layer positioned on the substrate;
at least one bottom conductive protrusion positioned on the bottom conductive layer;
an insulator layer positioned on the bottom conductive layer and the at least one bottom conductive protrusion;
at least one bottom insulating protrusion protruding from the insulator layer towards the bottom conductive layer and adjacent to the at least one bottom conductive protrusion; and
a top conductive layer positioned on the insulator layer;
wherein the bottom conductive layer, the at least one bottom conductive protrusion, the insulator layer, the at least one bottom insulating protrusion, and the top conductive layer together configure a capacitor structure, wherein a width of the bottom conductive layer is greater than a width of the top conductive layer.

* * * * *